US008264693B2

(12) United States Patent
Stoica et al.

(10) Patent No.: US 8,264,693 B2
(45) Date of Patent: Sep. 11, 2012

(54) METHOD AND SYSTEM FOR MEASURING AT LEAST ONE PROPERTY INCLUDING A MAGNETIC PROPERTY OF A MATERIAL USING PULSED LASER SOURCES

(75) Inventors: Vladimir A. Stoica, Ann Arbor, MI (US); Roy Clarke, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 870 days.

(21) Appl. No.: 12/315,906

(22) Filed: Dec. 8, 2008

(65) Prior Publication Data
US 2009/0212769 A1    Aug. 27, 2009

Related U.S. Application Data

(60) Provisional application No. 61/005,610, filed on Dec. 6, 2007.

(51) Int. Cl.
*G01B 11/02* (2006.01)
(52) U.S. Cl. ....................................................... 356/502
(58) Field of Classification Search .................. 356/432, 356/450, 502; 324/244.1
See application file for complete search history.

(56) References Cited

U.S. PATENT DOCUMENTS

| | | | |
|---|---|---|---|
| 4,710,030 A | 12/1987 | Tauc et al. | |
| 5,258,612 A | 11/1993 | Clark et al. | |
| 5,695,864 A | 12/1997 | Slonczewski et al. | |
| 5,706,094 A | 1/1998 | Maris | |
| 5,748,317 A | 5/1998 | Maris et al. | |
| 5,748,318 A | 5/1998 | Maris et al. | |
| 5,844,684 A | 12/1998 | Maris et al. | |
| 5,864,393 A | 1/1999 | Maris | |
| 5,959,735 A | 9/1999 | Maris et al. | |
| 6,008,906 A | 12/1999 | Maris | |
| 6,025,918 A | 2/2000 | Maris | |
| 6,038,026 A | 3/2000 | Maris | |
| 6,108,087 A | 8/2000 | Nikoonahad et al. | |
| 6,175,416 B1 | 1/2001 | Maris et al. | |
| 6,191,855 B1 | 2/2001 | Maris | |

(Continued)

OTHER PUBLICATIONS

Ju, Ganping, et al., Ultrafast Time Resolved Photoinduced Magnetization Rotation in a Ferromagnetic/Antiferromagnetic Exchange Coupled System, Physical Review Letters, vol. 82, No. 18, May 3, 1999, pp. 3705-3708.

(Continued)

*Primary Examiner* — Gregory J Toatley
*Assistant Examiner* — Dominic J Bologna
(74) *Attorney, Agent, or Firm* — Brooks Kushman P.C.

(57) ABSTRACT

A method of measuring at least one property including a magnetic property of target material is provided. A pump pulse train having one or more pump pulses is generated. The target material is irradiated with at least a portion of the one or more pump pulses so as to cause transient perturbation in the target material. At least one probe pulse train is generated having one or more probe pulses. The target material is irradiated with at least a portion of the one or more probe pulses to obtain one or more reflected probe pulses which are modulated based on the transient perturbation. A time interval between a time at which the target material is irradiated by each of the pump pulses and a time at which the target material is irradiated by each of its corresponding probe pulses is controlled. Each modulated probe pulse is detected.

28 Claims, 17 Drawing Sheets

U.S. PATENT DOCUMENTS

| | | | |
|---|---|---|---|
| 6,208,418 B1 | 3/2001 | Maris | |
| 6,208,421 B1 | 3/2001 | Maris et al. | |
| 6,211,961 B1 | 4/2001 | Maris | |
| 6,268,916 B1 | 7/2001 | Lee et al. | |
| 6,271,921 B1 | 8/2001 | Maris et al. | |
| 6,317,216 B1 | 11/2001 | Maris | |
| 6,321,601 B1 | 11/2001 | Maris | |
| 6,381,019 B1 | 4/2002 | Maris | |
| 6,400,449 B2 | 6/2002 | Maris et al. | |
| 6,501,269 B1 | 12/2002 | Vajda | |
| 6,504,618 B2 | 1/2003 | Morath et al. | |
| 6,512,586 B2 | 1/2003 | Maris | |
| 6,552,803 B1 | 4/2003 | Wang et al. | |
| 6,563,591 B2 | 5/2003 | Maris | |
| 6,694,284 B1 | 2/2004 | Nikoonhad et al. | |
| 6,950,196 B2 | 9/2005 | Fielden et al. | |
| 7,006,221 B2 | 2/2006 | Wolf et al. | |
| 7,044,636 B2 | 5/2006 | Taketoshi et al. | |
| 7,050,178 B2 | 5/2006 | Morath et al. | |
| 7,139,083 B2 | 11/2006 | Fielden et al. | |
| 7,166,997 B2 | 1/2007 | Ju et al. | |
| 7,230,844 B2 | 6/2007 | Deak et al. | |
| 7,339,676 B2 | 3/2008 | Maris | |
| 2008/0251740 A1* | 10/2008 | Dilhaire et al. | 250/578.1 |

OTHER PUBLICATIONS

Van Kampen, M., et al., All-Optical Probe of Coherent Spin Waves, Physical Review Letters, vol. 88, No. 22, Jun. 3, 2002, pp. 227201-1-227201-4.

Schreiber, F., et al., Gilbert Damping and g-Factor in FexCo1-X Alloy Films, Solid State Communications, vol. 93, No. 12, 1995, pp. 965-968.

Farle, Michael, Ferromagnetic Resonance of Ultrathin Metallic Layers, Rep. Prog. Phys. 61, 1998, pp. 755-826.

Kalarickal, Sangita S., et al., Ferromagnetic Resonance Linewidth in Metallic Thin Films: Comparison of Measurement Methods, Journal of Applied Physics 99, 093909, 2006, pp. 093909-1-093909-7.

Patton, Carl E., Linewidth and Relaxation Processes for the Main Resonance in the Spin-Wave Spectra of Ni-Fe Alloy Films, Journal of Applied Physics, vol. 39, No. 7, Jun. 1968, pp. 3060-3068.

Krebs, J.J., et al., Ferromagnetic Resonance Studies of Very Thin Epitaxial Single Crystals of Iron, Journal of Applied Physics 53 (11), Nov. 1982, pp. 8058-8060.

Johnson, P.B., et a., Optical Constants of Transition Metals: Ti, V, Cr, Mn, Fe, Co, Ni, and Pd, Physical Review B, vol. 9, No. 12, Jun. 15, 1974, pp. 5056-5070.

Damon, R.W., et al., Magnetostatic Modes of a Ferromagnet Slab, J. Phys, Chem. Solids, Pergamon Press vol. 19, Nos. 3/4, 1961, pp. 308-320.

Madami, M., et al., In Situ Brillouin Scattering Study of the Thickness Dependence of Magnetic Anisotropy, in Uncovered and Cu-Covered Fe/GaAs(100) Ultrathin Films, Physical Review B 69, 144408, 2004, pp. 144408-1-144408-7.

Sandercock, J.R., et al., Light Scattering From Thermal Magnons in Iron and Nickel, IEEE Transactions on Magnetics, vol. Mag-14, No. 5, Sep. 1978, pp. 442-444.

Puszkarski, H., Theory of Surface States in Spin Wave Resonance, Prog. Surf. Sci. 9, 1979, pp. 191-247.

Barman, A., et al., Size Dependent Damping in Picosecond Dynamics of Single Nanomagnets, Applied Physics Letters 90, 202504, 2007, pp. 202504-1-202504-3.

Greunberg, P., et al., Layered Magnetic Structures: Evidence for Antiferromagnetic Coupling of Fe Layers Across Cr Interlayers, Physical Review Letters, vol. 57, No. 19, Nov. 10, 1986, pp. 2442-2445.e.

Beaurepaire E., et al., Ultrafast Spin Dynamics in Ferromagnetic Nickel, Physical Review Letters, vol. 76, No. 22, May 27, 1996, pp. 4250-4253.

Kaganov, M.I., et al., Relaxation Between Electrons and the Crystalline Lattice, Sov. Phys. JETP 4, 1957, pp. 173-180.

Krinchik, G.S., et al., Magneto-Optical Properties of Ni, Co and Fe in Ultraviolet Visible and Infrared Parts of Spectrum, Sov. Phys. JEETP 26, 1968, pp. 1080-1085.

W.T. Barnes, Jr., "Modulated Gain Spectroscopy", Ph.D. Dissertation, Purdue University, West Lafayette, Indiana (1980).

V.A. Stoica, R. Merlin, R.A. Lukaszew, and R. Clarke, "Time-resolved spin dynamics studies of ferromagnetic thin films grown by molecular beam epitaxy", presented at APS March Meeting, Los Angeles, CA, USA, Mar. 21-25, 2005.

J. Smith and H.G. Beljers, Philips Res. Rep. 10, 113, (1955).

Stoica, Vladimir A., et al., Wideband Detection of Transient Solid-State Dynamics Using Ultrafast Fiber Lasers and Asynchronous Optical Sampling, Optics Express, 16, No. 4., 2322, 2008, pp. 1-14.

Elzinga, Paul A., et al., Pump/Probe Spectroscopy by Asynchronous Optical-Sampling, Applied Spectroscopy, vol. 41, No. 1, 1987, pp. 2-4.

Antonelli, G. Andrew, et al., Characterization of Mechanical and Thermal Properties Using Ultrafast Optical Metrology, MRS Bulletin, vol. 31, Aug. 2006, pp. 607-613.

Merlin, R., Generating Coherent THz Phonons With Light Pulses, Solid State Communciations, vol. 102, No. 2-3, 1997, pp. 207-220.

Capinski, Willliam S., et al., Improved Apparatus for Picosecond Pump-and-Probe Optical Measurements, Rev. Sci. Instrum. vol. 67, No. 8, Aug. 1996, pp. 2720-2726.

Lill, E., et al., Rapid Optical Sampling of Relaxation-Phenomena Employing Two Time-Correlated Picosecond Pulsetrains, Applied Physics, No. 14, 1977, pp. 399-401.

Bartels, A., et al., Femtosecond Time-Resolved Optical Pump-Probe Spectroscopy at Kilohertz-Scan-Rates Over Nanosecond-Time-Delays Without Mechanical Delay Line, Applied Physics Letters 88, 041117, 2006, pp. 041117-1-041117-3.

http://www.menlosystems.com, Sep. 29, 2009.

Adachi, Satoru, et al., Dual Wavelength Optical Sampling Technique for Ultrafast Transient Bleaching Spectroscopy, Optics Communications, 117, May 15, 1995, pp. 71-77.

Lannin, J.S., et al., Second-Order Raman Scattering in the Group-Vb Semimetals: Bi, Sb, and As, Physical Review B, vol. 12, No. 2, Jul. 15, 1975, pp. 585-593.

Postava, K., et al., Linear and Quadratic Magneto-Optical Measurements of the Spin Reorientation in Epitaxial Fe Films on MgO, Journal of Magnetism and Magnetic Materials, 172, 1997, pp. 199-208.

Cho, G. C., et al., Subpicosecond Time-Resolved Coherent-Phonon Oscillations in GaAs, Physical Review Letters, vol. 65, No. 6, Aug. 6, 1990, pp. 764-766.

Stevens, Robert J., et al., Measurement of Thermal Boundary Conductance of a Series of Metal-Dielectric Interfaces by the Transient Thermoreflectance Technique, Journal of Heat Transfer, vol. 127, Mar. 2005, pp. 315-322.

Stoner, R.J., et al, Kapitza Conductance and Heat Flow Between Solids at Temperatures from 50 to 300 K, Physical Review B, vol. 48, No. 22, Dec. 1, 1993-II, pp. 16373-16387.

Paddock, Carolyn A., et al., Transient Thermoreflectance From Thin Metal Films, Journal of Applied Physics 60, Jul. 1, 1986, pp. 285-290.

Thomsen, C., et al., Surface Generation and Detection of Phonons by Picosecond Light Pulses, Physical Review B, vol. 34, No. 6, Sep. 15, 1986, pp. 4129-4138.

Miller, J.K., et al., Near-Bandgap Wavelength Dependence of Long-Lived Traveling Coherent Longitudinal Acoustic Phonons in GaSb-GaAs Heterostructures, Physical Review B 74, 113313, 2006, pp. 113313-1-113313-4.

Aspnes, D.E., et al., Dielectric Functions and Optical Parameters of Si, Ge, GaP, GaAs, GaSb, InP, InAs, and InSb From 1.5 to 6.0 eV, Physical Review B, vol. 27, No. 2, Jan. 15, 1983, pp. 985-1009.

McSkimin, H.J., Measurement of Elastic Constants at Low Temperatures by Means of Ultrasonic Waves—Data for Silicon and Germanium Single Crystals, and for Fused Silica, Journal of Applied Physics, vol. 24, No. 8, Aug. 1953, pp. 988-997.

* cited by examiner

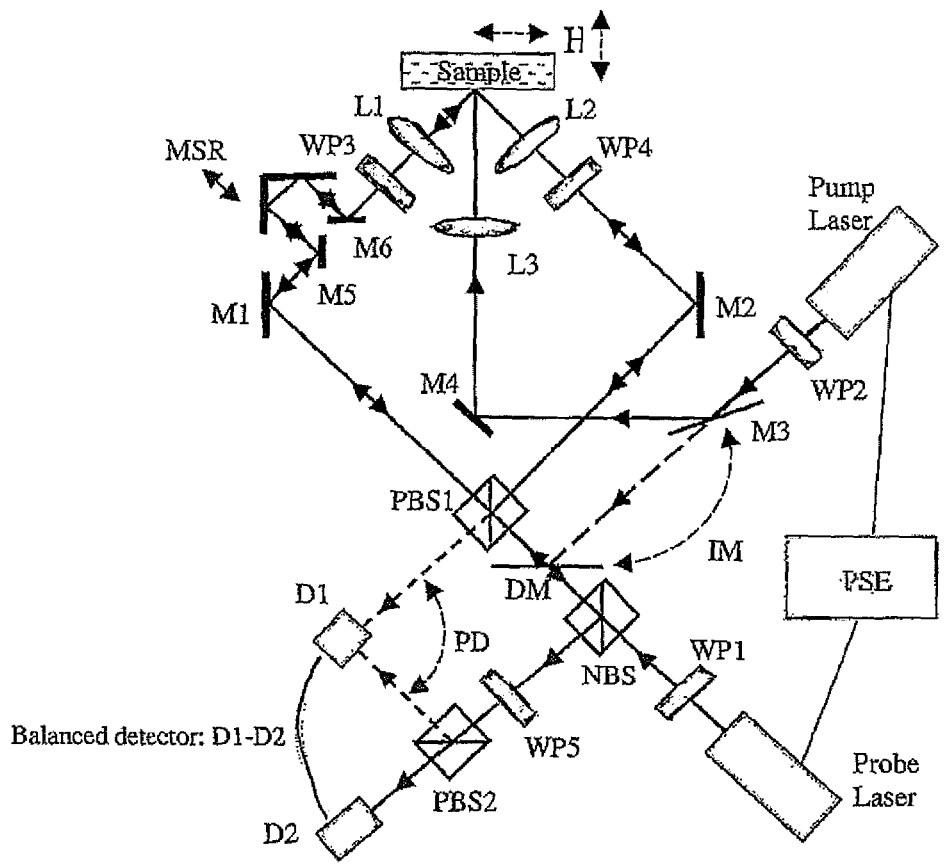

Fig. 5 Dual-Laser Magnetometer with Oblique Incidence Interferometer and Variable Inter-pulse Temporal Separation.

Legend:

| | |
|---|---|
| H | - magnetic field applied either in-plane or out-of-plane with respect to sample |
| L1-3 | - lenses (can be replaced by focusing mirrors) |
| M1-6 | - mirrors |
| WP1-5 | - waveplates |
| MSR | - motorized stage mirror retroreflector for fine tuning of interferometer inter-pulse temporal separation |
| DM | - dichroic mirror |
| D1-2 | - photodectors 1 and 2 (interconnected for signal subtraction) |
| IM | - interchangeable mirrors; signifies that either DM or M3 is used for directing pump laser on the sample at oblique or normal incidence, respectively |
| PD | - preferential detection; signifies a dual choice for detection at D1 |
| PSE | - phase synchronization electronics (keeps the difference frequency between the lasers fixed) |
| PBS1-2 | - polarizing beam splitters |
| NBS | - non-polarizing beam splitter |

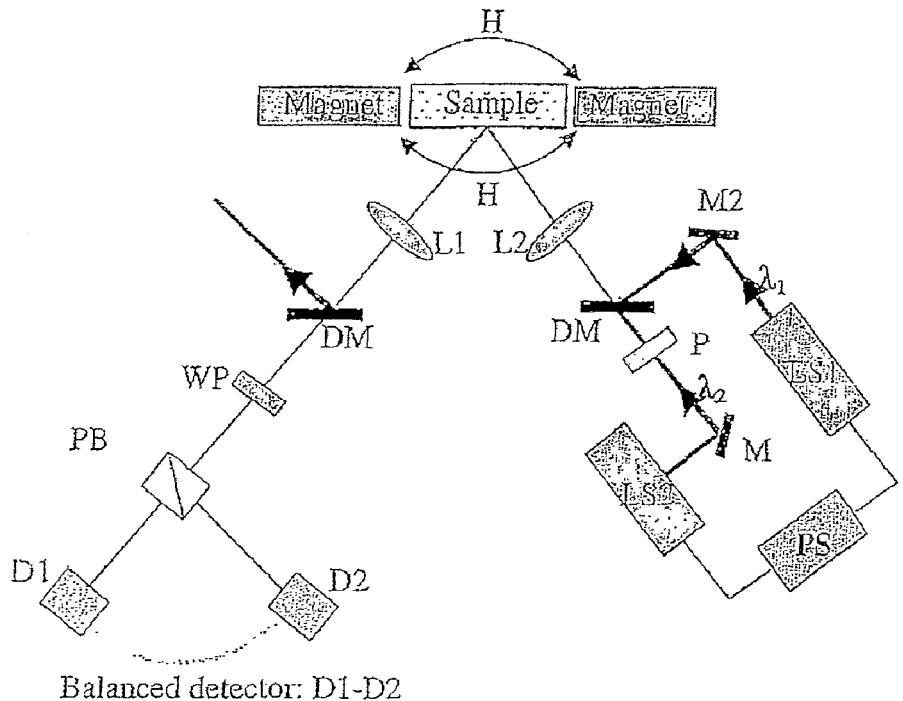

Balanced detector: D1-D2

Legend:
H             - magnetic field
LS1, LS2      - laser 1 and 2 (the same or different wavelengths)
L1, L2        - lens 1 and 2 (can be replaced by focusing mirror)
M1, M2        - mirrors 1 and 2
DM1, DM2      - dichroic mirrors 1 and 2
P             - polarizer
WP            - waveplate
BS            - beam splitter
D1,D2         - detectors 1 and 2 - balanced
PSE           - phase synchronization electronics (drives the piezoelectric actuators inside the laser cavity to keep the phase fixed at: $\Delta\nu = \nu_{laser1} - \nu_{laser2}$, where $\nu$ is the frequency)

FIG. 6

(a) Short-term lattice dynamics for mechanical property measurement.

b) Long term cooling rate measurement for an Iron thin film on Germanium.

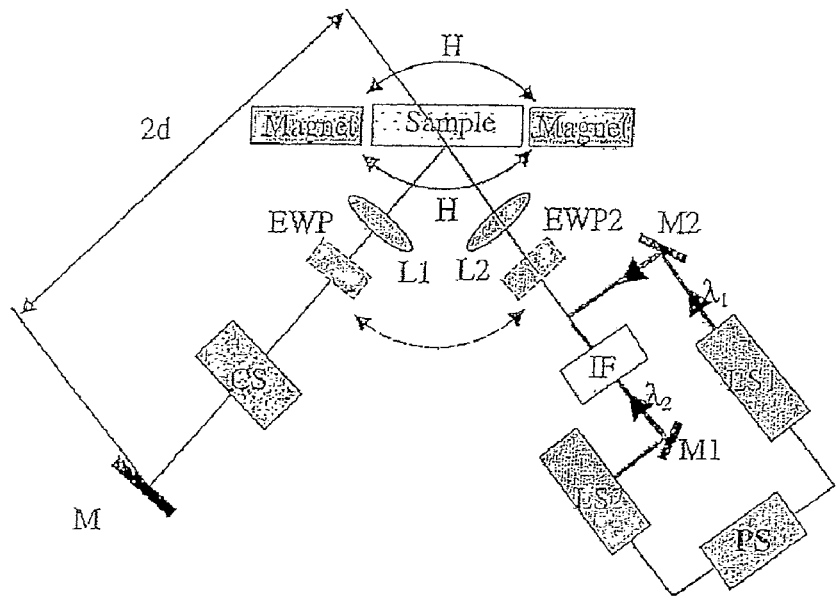

Legend:
H — magnetic field
L1, L2 — lens 1 and 2 (can be replaced by focusing mirror)
M1, M2, M3 — mirrors 1, 2, and 3
EWP1, EWP2 — exchangeable waveplates 1 and 2
IFM — interferometer
CS — collimation system d — delay, $2d = \dfrac{c}{\nu_{probelaser}}$ ; c - light speed, $\nu$ - frequency PSE — phase synchronization electronics (drives the piezoelectric actuators inside the laser cavity to keep the phase fixed);

$\Delta \nu = \nu_{laser1} - \nu_{laser2}$; -- frequency)

FIG. 10a

Legend:
M1 - M5 — mirrors 1, 2, 3 and 4
PBS1, PBS2, PBS3 — polarized beam splitters 1, 2 and 3
NPBS — non-polarized beam splitter
WP — waveplate

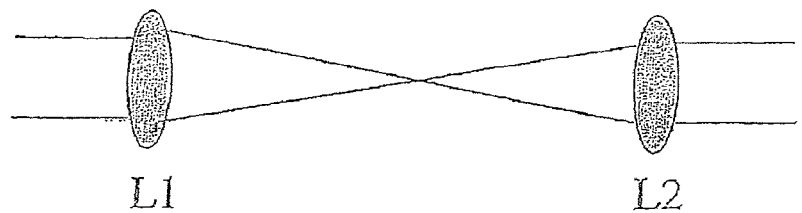
FIG. 10c1
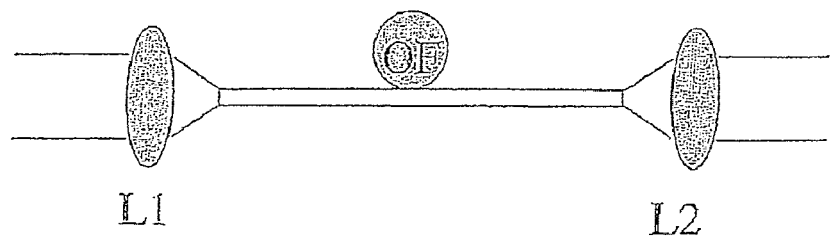
Legend:
L1, L2 — lens 1 and 2
OF — optical fiber
FIG. 10c2

METHOD AND SYSTEM FOR MEASURING AT LEAST ONE PROPERTY INCLUDING A MAGNETIC PROPERTY OF A MATERIAL USING PULSED LASER SOURCES

CROSS-REFERENCE TO RELATED APPLICATION

This application claims the benefit of U.S. provisional application Ser. No. 61/005,610 filed Dec. 6, 2007 entitled "Wideband Detection of Transient Solid-State Dynamics Using Ultrafast Fiber Lasers And Asynchronous Optical Sampling (ASOPS)".

STATEMENT REGARDING FEDERALLY SPONSORED RESEARCH OR DEVELOPMENT

The invention was made with Government support under Grant PHY-0114336. The Government has certain rights to the invention.

BACKGROUND OF THE INVENTION

1. Field of the Invention

This invention relates to methods and systems for measuring at least one property including a magnetic property of a material using pulsed laser sources. One embodiment of the present invention relates to method and apparatus for measurements of magnetic, thermal and mechanical properties of materials including magnetic thin films and their patterned structures. More particularly, one embodiment of the invention pertains to a method and system that optically stimulate spin oscillations and/or magnetization switching, optically induces thermo-elastic expansion in magnetic materials, and optically measures magnetic and thermo-elastic relaxation transients to determine magnetic, thermal and mechanical properties of magnetic thin films and their patterned structures.

2. Background Art

References Cited

The following references are cited herein:
U.S. Patent Documents

| U.S. Pat. No. 5,695,864 | December 1997 | Slonczewski et al. |
| U.S. Pat. No. 7,230,844 | June 2007 | Deak et al. |
| U.S. Pat. No. 6,501,269 | December 2002 | Vajda at al. |
| U.S. Pat. No. 7,166,997 | January 2007 | Ju et al. |

Other References

1. V. A. Stoica, Y.-M. Sheu, D. A. Reis, and R. Clarke, "Wideband detection of transient solid-state dynamics using ultrafast fiber lasers and asynchronous optical sampling," Optics Express, 16, 2322 (2008).

2. P. A. Elzinga, F. E. Lytle, Y. Jiang, G. B. King, and N. M. Laurendeau, "Pump probe spectroscopy by asynchronous optical-sampling," Appl. Spectrosc. 41, 2-4 (1987).

3. G. A. Antonelli, B. Perrin, B. C. Daly, and D. G. Cahill, "Characterization of mechanical and thermal properties using ultrafast optical metrology," MRS Bull. 31, 607-613 (2006).

4. R. Merlin, "Generating coherent THz phonons with light pulses," Sol. Stat. Comm. 102, 207-220 (1997).

5. W. S. Capinski and H. J. Maris, "Improved Apparatus for Picosecond Pump-and-Probe Optical Measurements," Rev. Sci. Instrum., 67, 2720-2726 (1996).

6. E. Lill, S. Schneider, and F. Dorr, "Rapid optical sampling of relaxation-phenomena employing two time-correlated picosecond pulse trains," Appl. Phys. 14, 399-401 (1977).

7. W. T. Barnes, Jr., "Modulated gain spectroscopy," Ph.D. Dissertation, Purdue University, West Lafayette, Ind. (1980).

8. A. F. Bartels, F. Hudert, C. Janke, T. Dekorsy, and K. Kohler, "Femtosecond time-resolved optical pump-probe spectroscopy at kilohertz-scan-rates over nanosecond-time-delays without mechanical delay line," Appl. Phys. Lett. 88, 041117 (2006).

9. http://www.menlosystems.com.

10. S. Adachi, S. Takeyama, and Y. Takagi, "Dual wavelength optical sampling technique for ultrafast transient bleaching spectroscopy," Opt. Commun. 117, 71-77 (1995).

11. J. S. Lannin, J. M. Calleja, and M. Cardona, "Second-order Raman scattering in the group-Vb semimetals: Bi, Sb, and As," Phys. Rev. B 12, 585-593 (1975).

12. K. Postava, H. Jaffres, A. Schuhl, F. Nguyen Van Dau, M. Goiran, and A. R. Fert, "Linear and quadratic magneto-optical measurements of the spin reorientation in epitaxial Fe films on MgO," J. Magn. Magn. Mater. 172, 199-208 (1997).

13. G. C. Cho, W. Kütt, and H. Kurz, "Subpicosecond time-resolved coherent-phonon oscillations in GaAs," Phys. Rev. Lett. 65, 764-766 (1990).

14. M. I. Kaganov, I. M. Lifshitz, and L. V. Tanatarov, "Relaxation between electrons and the crystalline lattice," Sov. Phys. JETP 4, 173-180 (1957).

15. R. J. Stevens, A. N. Smith, and P. M. Norris, "Measurement of thermal boundary conductance of a series of metal-dielectric interfaces by the transient thermoreflectance technique," 127, 315-322 (2005).

16. R. J. Stoner, and H. J. Maris, "Kapitza conductance and heat-flow between solids at temperatures from 50 to 300 K," Phys. Rev. B 48, 16373-16387 (1993).

17. C. A. Paddock and G. L. Eesley, "Transient thermoreflectance from thin metal-films," J. Appl. Phys. 60, 285-290 (1986).

18. C. Thomsen, H. T. Grahn, H. J. Maris, and J. Tauc, "Surface generation and detection of phonons by picosecond light-pulses," Phys. Rev. B 34, 4129-4138 (1986).

19. J. K. Miller, J. Qi, Y. Xu, Y.-J. Cho, X. Liu, J. K. Furdyna, I. Perakis, T. V. Shahbazyan, and N. Tolk, "Near-bandgap wavelength dependence of long-lived traveling coherent longitudinal acoustic phonons in GaSb—GaAs heterostructures," Phys. Rev. B 74, 113313 (2006).

20. D. E. Aspnes and A. A. Studna, "Dielectric functions and optical parameters of Si, Ge, GaP, GaAs, GaSb, InP, InAs, and InSb from 1.5 to 6.0 eV," Phys. Rev. B 27, 985-1009 (1983).

21. H. J. McSkimin, "Measurement of elastic constants at low temperatures by means of ultrasonic waves—data for silicon and germanium single crystals, and for fused silica," J. Appl. Phys. 24, 988-997 (1953).

22. G. Ju, A. V. Nurmikko, R. F. C. Farrow, R. F. Marks, M. J. Carey, and B. A. Gurney, "Ultrafast time resolved photoinduced magnetization rotation in a ferromagnetic/antiferromagnetic exchange coupled system," Phys. Rev. Lett. 82, 3705-3708 (1999).

23. M. van Kampen, C. Jozsa, J. T. Kohlhepp, P. LeClair, L. Lagae, W. J. M. de Jonge, and B. Koopmans, "All-optical probe of coherent spin waves," Phys. Rev. Lett. 88, 227201 (2002).

24. V. A. Stoica, R. Merlin, R. A. Lukaszew, and R. Clarke, "Time-resolved spin dynamics studies of ferromagnetic thin films grown by molecular beam epitaxy," presented at APS March Meeting, Los Angeles, Calif., USA, 21-25 Mar. 2005.

25. F. Schreiber, J. Pflaum, Z. Frait, Th. Muhge, and J. Pelzl, "Gilbert damping and g-factor in FexCol-x alloy films," Sol. Stat. Comm. 93, 965-968 (1995).

26. M. Farle, "Ferromagnetic resonance of ultrathin metallic layers," Rep. Prog. Phys. 61, 755-826 (1998).

27. S. S. Kalarickal, P. Krivosik, M. Z. Wu, C. E. Patton, M. L. Schneider, P. Kabos, T. J. Silva, J. P. Nibarger, "Ferromagnetic resonance linewidth in metallic thin films: Comparison of measurement methods," J. Appl. Phys. 99, 093909 (2006).

28. C. E. Patton, "Linewidth and relaxation processes for main resonance in spin-wave spectra of Ni—Fe alloy films," J. Appl. Phys. 39, 3060-3068 (1968).

29. J. J. Krebs, F. J. Rachford, P. Lubitz, and G. A. Prinz, "Ferromagnetic resonance studies of very thin epitaxial single-crystals of iron," J. Appl. Phys. 53, 8058-8060 (1982).

30. P. B. Johnson and R. W. Christy, "Optical constants of transition metals: Ti, V, Cr, Mn, Fe, Co, Ni, and Pd," Phys. Rev. B 9, 5056-5070 (1974).

31. R. W. Damon and J. R. Eshbach, "Magnetostatic modes of a ferromagnetic slab," J. Phys. Chem. Solids 19, 308-320 (1961).

32. M. Madami, S. Tacchi, G. Carlotti, G. Gubbiotti, and R. L. Stamps, "In situ Brillouin scattering study of the thickness dependence of magnetic anisotropy in uncovered and Cu-covered Fe/GaAs(100) ultrathin films," Phys. Rev. B 69, 144408 (2004).

33. J. R. Sanderock and W. Wettling, "Light scattering from thermal magnons in iron and nickel," IEEE Trans. Magn. 14, 442-444 (1978).

34. H. Puszkarski, "Theory of surface states in spin wave resonance," Prog. Surf. Sci. 9, 191-247 (1979).

35. G. S. Krinchik and V. A. Artem'ev, "Magneto-optical properties of Ni, Co and Fe in ultraviolet visible and infrared parts of spectrum," Sov. Phys. JETP 26, 1080-1085 (1968).

36. A. Barman, S. Wang, J. Maas, A. R. Hawkins, S. Kwon, J. Bokor, A. Liddle, H. Schmidt, "Size dependent damping in picosecond dynamics of single nanomagnets," Appl. Phys. Lett. 90, 202504 (2007).

37. P. Grünberg, R. Schreiber, Y. Pang, M. B. Brodsky, and H. Sowers, "Layered Magnetic Structures: Evidence for Antiferromagnetic Coupling of Fe Layers across Cr Interlayers," Phys. Rev. Lett. 57, 2442-2445 (1986).

38. E. Beaurepaire et al., Phys. Rev. Lett. 76, 4250 (1996).

39. J. Smit and H. G. Beljers, Philips Res. Rep. 10, 113, (1955).

Recent developments and future prospects of large volume commercialization of magnetic random access memories (MRAM) have raised the need to develop accurate magnetic characterization techniques for quality control during the fabrication processes of the magnetic layered structures. Particular MRAM device designs use high density currents to induce spin-torque switching (U.S. Pat. No. 5,695,864) in the magnetic layers forming the MRAM stack, which can induce significant Joule heating and place the operating temperatures of MRAM devices at large levels above ambient temperature. In another design, the improvement in magnetothermal NRAM operation is based on use of heating (see U.S. Pat. No. 7,230,844). These examples elevate the additional need for measurements of the thermal characteristics of the magnetic materials. Since the large thermal gradients can also induce significant mechanical stresses, it is further needed to determine the effect of these stresses on the magnetic properties of magnetic layers used in MRAM devices.

Magnetic properties of thin films are presently studied using a number of techniques. In one technique, continuous wave (CW) electromagnetic radiation field is used to excite the magnetic frequency spectrum that is characteristic for a particular magnetic material sample. In the ferromagnetic resonance technique, a microwave field is used simultaneously with a variable external magnetic field to drive a particular magnetic excitation of the sample in resonance with the microwave field. In this technique, the magnetic thin film sample is placed inside a resonant microwave cavity and requires sample size modification in order to fit to the size of this cavity. For the case of thin films the lateral resolution of the ferromagnetic resonance technique is poor.

In another technique, a magnetic thin film or related magnetic nanostructure is thermally excited with an optical laser beam focused on a sample and inelastic magnetic Brillouin scattering is measured to record the laser excited frequency spectrum of thermal spin waves, which corresponds to spectral shifts of less than 500 GHz from the incident laser frequency. In the Brillouin light scattering technique the magnetic excitation spectrum is measured by scanning a multipass Fabry-Perot spectrometer at mechanical motion speeds that correspond to long measurement acquisition times.

In another technique, the magneto-optical Kerr effect (MOKE), which corresponds to a change of polarization state of electromagnetic radiation reflected from a magnetic material, is used for characterization of the magnetic thin films. This technique can be applied for measurements of very thin films with thickness down to a few atomic layers and the lateral resolution is only limited by wavelength of light. A variable external magnetic field is used to rotate the magnetization orientation in the material that is further measured with MOKE. In non-destructive sample characterization using MOKE, the external field is produced using an electromagnet and the external magnetic field switching rates are typically on the order of 1 kHz or less. Based on application of magnetic field alone, the time resolution capabilities of material characterization using MOKE is modest considering than the magnetization precession magnetic materials occurs at characteristic frequencies on the order of at least a few GHz.

Several applications that use MOKE for measurements of magnetic properties are already used by industry. For example, U.S. Pat. No. 6,501,269, "Vector Kerr magnetometry", describes simultaneous transversal and longitudinal Kerr effect measurements of magnetic properties in anisotropic magnetic materials as a function of optical spot location on the characterized sample. In another example, U.S. Pat. No. 7,166,997, "Complex transverse AC magneto-optic susceptometer for determination of volume and anisotropy field distribution in recording media", describes determination of volume and anisotropy field distribution of thin film granular material based on MOKE measurements of the AC susceptibility of the sample. These techniques do not provide means to study magnetization rotation and oscillatory magnetic dynamics processes that can occur at characteristic GHz frequencies, nor can they be used to determine sub-nanosecond magnetization relaxation rates Time-resolved pump-probe optical spectroscopy based on ultrafast lasers is often used to study laser-induced transient-dynamics in solid-state materials. An intense laser-pump pulse induces a fast perturbation of the material properties, the evolution of which can be studied through concomitant changes in the optical properties, as measured by a time-delayed probe pulse. Typically the probe pulse is derived from the pump, and delayed by mechanical means.

Optical pump-probe spectroscopy applications are already well developed for characterizing the transient dynamics of materials. Examples include acoustic wave propagation, thin film thickness and adhesion to the substrate, the evaluation of thermal properties such as thin film thermal conductivity and thermal boundary resistance [3], and the generation and detection of coherent optical phonons [4]. These measurements are traditionally performed using slow mechanical scanning of an optical retro-reflector to achieve the pump-probe time delay. This limits the speed and efficiency of data acquisition, especially when extended time delays are required.

In one time-resolved technique, femtosecond MOKE probing was exploited for studies of ultrafast magnetic phenomena that are excited with an intense optical pump pulse [38]. In another technique, optical pulses were used to excite magnetic oscillations on the picosecond time scale, which can be further used to dynamically determine the magnetic properties of materials [22-24]. In these studies, optical pump and probe pulses where derived from a single laser source and a mechanical translation line was employed for time delay scanning. The measured oscillation frequencies can be related to magnetic anisotropy contributions, saturation magnetization, and exchange interaction. These studies are usually limited to time delays of around 1 ns, being susceptible to errors related to spot size variations and pointing instabilities present during the mechanical scanning. The mechanical time delay scanning limitations were discussed in detail in [1]. A dual laser technique using small footprint and compact fiber lasers was alternatively proposed, which employs asynchronous optical sampling (ASOPS) [2] at kilohertz rates for time delay scanning to circumvent the limitations of prior art techniques using mechanical time delay scanning.

A number of techniques are presently used by industry for measurements of mechanical properties of thin films (see for example the opaque film metrology at: http://www.rudolphtech.com) that employ pulsed laser excitation and characterization. The efficiency of ASOPS technique for similar applications such is the detection of acoustic phonons vibrations was demonstrated only recently by Bartels et al. [8], even though the principle of the ASOPS technique was established about three decades ago [6-7]. While such experimental capabilities are very attractive, the total time span was limited to one nanosecond, imposed by the laser repetition rate, which is not suitable for reliable magnetic characterization that takes longer to relax for magnetic materials of interest such Fe based alloys. Since the ASOPS technique relies on stroboscopic excitation and probing, the repetitive pulse excitation needs not to exceed the magnetic and thermal relaxation rates in order to permit the accurate measurements of magnetic and thermal properties in magnetic materials.

SUMMARY

It is within the scope of present invention (while it is not limited to this purpose only) to provide an efficient and sensitive technique for characterizing the magnetic, thermal and mechanical properties in thin films and their patterned structures to aid the development of MRAM fabrication processes.

Measurements can be applied to a broad range of magnetic materials comprised of in-plane and/or out of plane magnetized medium including ferromagnetic, antiferromagnetic and ferrimagnetic materials. In one class of materials, magnetic thermal and mechanical properties are measured in layered thin film structures that contain at least one selected element from the group comprising the elements Fe, Ni, Co, Mn, Cr, V, Nd, Sm, Eu, Gd, Tb, Dy and alloys including said elements. In another class of materials, magnetic, thermal and mechanical properties are measured in bulk materials that contain at least one selected element from the group comprising the elements Fe, Ni, Co, Mn, Cr, V, Nd, Sm, Eu, Gd, Tb, Dy and alloys including said elements.

It is within the scope of the present invention to provide an effective method and system for pulsed laser magnetometry that can simultaneously be applied to the measurements of the thermal and mechanical properties of magnetic thin films and their patterned structures.

In at least one embodiment, method and system for efficient time delay scanning for sensitive ultrafast optical magnetometry are realized through the use of two linked lasers together with specific detection schemes to determine thin film properties (interconnecting magnetic, thermal and mechanical parameters).

In at least one embodiment, method and system for performing dynamic measurements over a very large temporal range using a newly developed instrument based on ultrafast fiber lasers and asynchronous optical sampling (ASOPS) are provided [1]. The potential of the technique is illustrated by measurements on the thermal, mechanical, and magnetic properties of epitaxial iron thin films and their supporting substrates. Particular emphasis is placed on coherent magnetization oscillations and their relaxation. One aspect of this is how to separate the spin-wave effects from the non-magnetic contributions to the transient optical response.

In at least one embodiment, method and system based on the ASOPS technique with kilohertz scanning rates, a much improved experimental approach covering time delays from femtoseconds to several nanoseconds is provided. Scanning over several nanosecond time delays takes full advantage of the ASOPS technique by eliminating the need for mechanical translation over large distances, which usually requires systematic error compensation [5].

In at least one embodiment, the ASOPS technique capabilities are extended over much longer timescales for measuring relatively slow relaxation processes, such as thermal cooling and the detection of long-lived coherent acoustic or magnetic oscillations. The measurements may make use of fiber lasers with 100 MHZ repetition rates, ensuring that enough transit time for relaxation is available before the next stroboscopic excitation arrives and subsequent probing is repeated.

In at least one embodiment, an optical time-domain measurement technique is described, based on interlinked ultrashort-pulsed lasers, for determining/characterizing the properties of opaque and semi-opaque solid-state layers/multilayers with planar/nanostructured topographies that include materials with magnetic properties.

In at least one embodiment, ultrashort laser pulse irradiation of materials produces transient electronic, thermal, and coherent magnetic and acoustic excitations that are identified, separated and interlinked in complementary time-resolved optical detection processes to determine properties of interest. Time-resolved measurements are performed by varying the magnetic field strength and orientation, laser power and spot position with a spatial resolution starting at <1 µm and up to a few tens of µm, depending on geometrical constraints related to the instrumental functionality requirements. Examples of properties that can be measured include but are not limited to determining: magnetic anisotropy and magnetic moment; magnetic exchange interaction and coupling; intrinsic and extrinsic magnetic damping; magnetic hysteresis switching fields under/without additional intense pulsed-laser exposure; mechanical thin film and nanostructure dimensions; grain texture or structural anisotropy; thin film or nanostructure mechanical bonding strength and adhesion to a supporting substrate; thermal conductivity; thermal interface boundary conductance; thresholds for thermal damage; and optical and magneto-optical constants at the optical wavelengths of interest. Additionally, using laser intensity-dependent measurements or external heat sources, the thermal stability of a layer/multilayer structure or related device can be tested by mimicking the device functionality at higher temperature than the ambient, which is usually the case in practice for modern electronic circuits using the layered materials of interest.

In at least one embodiment, intense laser pulses are used for material excitation (derived from the pump laser) while weaker pulses from another laser (probe laser with a slightly different repetition rate) are used for detection from femtoseconds to nanoseconds after the excitation event, ensuring that a suitable temporal range is chosen for accurate measurements of relaxation rates following after excitation. The excitation and detection lasers are phase stabilized with respect to each other by maintaining a small constant frequency offset (CFO) between the individual laser repetition rates. In this way, the pulse trains from the lasers are rapidly and uniformly time-delayed relative to each other starting from an initial coincidence time and until the pulse trains coincide again and complete the scan of the full temporal range. The maximum time scanning interval range is given by the inverse of the pump laser repetition rate. The pulse trains coincidence event is repeated at a characteristic time given by the inverse of the constant frequency offset (CFO) to establish a typical scanning rate corresponding to a millisecond or less. The fast temporal scanning combined with high bandwidth parallel digital data acquisition is used to efficiently determine/characterize the material properties, including real-time monitoring of processing and fabrication procedures.

In at least one embodiment, detection and separation of various ultrashort laser-induced excitations (electronic, thermal, magnetic and acoustic) and the measurement of the associated time-dependent relaxation are performed using: a) multiple optical wavelengths and polarization analysis; and b) dual-pulse interferometry at normal or oblique angle of incidence (for either excitation or detection) in a suitable combination for practical purposes.

a) Multiple optical probes with different wavelengths (colors) are focused and overlapped on the sample in collinear geometry together with the pump beam to make use of spectral dependent characteristics such different material depth sensitivities or detection susceptibilities associated with the property of interest.

In at least one embodiment, color filters and dichroic mirrors are used to perform the pump and probe beam separation after sample reflection, with multiple-color-probes being individually monitored in parallel using dedicated photo-detectors. Separation of the same type of measurement contributions with a bulk or surface origin or extracting accurate relaxation rates from the wavelength-dependent depth sensitivities is performed using two probe colors that are either balanced with analog dual-photodiode detection or detected with parallel digitized signal acquisition followed by further signal processing. Separation of different measurement contributions (magnetic or thermal or acoustic) is done by parallel detection of multiple-color-probes that use distinct polarization analysis for enhancing detection of a certain type of excitation and suppressing the others. For example, enhanced magnetic contrast at a first wavelength is obtained by analyzing the magneto-optical Kerr effect rotation with orthogonal polarization beam splitting and dual photo-detector balancing, while thermal measurement contrast at a second wavelength is obtained by monitoring the s-polarized probe thermoreflectivity with no polarization analyzer. For the case of layers/multilayers or related nanostructures with configurational or structural anisotropy, additional color separation for dedicated detection is performed for monitoring the structure-associated anisotropic reflectance as a function of the probe beam polarization, used to enhance the acoustic signal detection. The individually separated signals can be interlinked to extract and make corrections in measuring the property of interest. Such is the case of the magnetic relaxation measurement corrections that are connected to a parallel thermal relaxation process.

For cases when it is needed to extract the measurement contribution for a layer of interest from undesired thermal or acoustic transients in the adjacent materials, a suitable probe beam wavelength is chosen in the transparency spectrum for the adjacent materials while keeping absorbing characteristics for the measured layer.

In at least one embodiment, determination of the material optical and magneto-optical constants, which often deviate from bulk values when the layered material is thin, is made at two complementary angles of incidence (oblique and normal incidence) by measurements of probe reflectivity with variable polarization.

b) Dual-pulse interferometry schemes are used to improve the detection sensitivity for probing of coherent magnetic and acoustic excitations. The functionality is provided through elimination of signals that are not coherent and providing optimal phase matching conditions for the detection of the coherent part of the signal. Additionally, interferometric Sagnac-type detection can be applied for measurements of the magnetic field induced hysteresis by eliminating undesired non-magnetic optical polarization rotations associated with optical sample properties or with various optical components used for instrumentation.

i) Sagnac-type interferometry at normal incidence is used based on two counterpropagating pulses traveling through the same optical setup. An original probe pulse from one of the lasers crosses first a semitransparent non-polarizing beam splitter. Two pulses are then obtained from the original single pulse by polarization pulse splitting into orthogonal components that travel almost matched beampaths (directed by mirrors), are rotated with half waveplates, are further recombined collinearly with another polarization beamsplitter, cross a quarter wave plate and are directed and focused on sample at normal incidence. After the reflection from the measured layer of interest the two pulses interchange the beam paths to travel the beampath of the other pulse from the initial trip to the layer. The scheme can be applied to either the pump or the probe beams and includes a small beam path adjustment available on the path traveled by one of the two orthogonal components. The adjustment is performed by using a motorized movable retroreflector mirror in order to phase-match the frequency of oscillation (magnetic or acoustic) for enhanced coherent probing of the layered material. Search of optimal beam path adjustment for coherent based enhancement of detection (when using probe pulses) or excitation (when using pump pulses) can be monitored in real-time using the fast pump-probe time delay scanning provided by CFO. While for the case of using the pump pulse interferometry, the returning pulses are rejected with a dichroic mirror, while for the case of the dual probe pulse interferometry the recombined pulses are directed, using the initial semitransparent non-polarizing beam splitter, toward a dual balanced photo-detector through a polarization beamsplitter.

ii) Sagnac-type interferometry at oblique angle of incidence is used based on two counterpropagating pulses traveling through the same optical setup. The scheme from i) above remains the same until the sample reflection. After the sample reflection the orthogonal probe pulses travel a distance equivalent to the speed of light divided by two times the laser repetition rate and are redirected along the incoming beampath by an end mirror at normal incidence. This scheme assures that the each individual orthogonal probe pulse probes the sample twice and at the same time delay with respect to the pump beam to improve the detection sensitivity even further. The quarter waveplate placed before the first sample reflection can be now alternatively placed before the end mirror. The rest of the setup is the same as in i), except that for the case of using the pump beam interferometry then the rejection of the pulses is made with a dichroic mirror placed before the end mirror.

iii) It is expected that other types (without common beampath) of dual-probe interferometry can be employed with good results for detection enhancement. The difference is that a reference pulse is directed on a portion of the material not exposed to pump beam irradiation and combined collinearly for overlapping on the detector with the associated probe pulse that was pump modified. Such a scheme is advantageous in at least one embodiment because both probe pulses can be made to contain similar amounts of non-coherent background (to be subtracted through interference) while exhibiting a similar sample effect on the probe pulse spectrum. Additional and independent phase compensation can be pursued, based on polarization waveplates, for optimal coherent probing realization.

In at least one embodiment, the pump beam intensity is controlled to measure sample properties (magnetic and thermal) as a function of pump pulse input power (this can determine the grain size and film roughness if calibration with known sample is used). Thermal film boundary conductance and film thermal conductivity and/or film thickness can be obtained from reflectivity measurements and magnetic properties from magneto-optical measurements.

In at least one embodiment, one can use pulse picking to select sub-harmonic frequencies from a fixed repetition rate laser or one can use multiple pulse splitting after the laser output to produce higher repetition rates of excitation and/or probing on the target material.

The method is also applicable for non-overlapping beams up to distances of about 3 times the spot size. The overlap between the pump and probe beams and their reflection can be done on the same side of the target material or specimen (both beams incident and reflected in the half plane delimited by sample surface) or on opposite sides (front and backside pump and probe beams in either order).

Multiple non-collinear beams can be used also (either at normal or oblique incidence and reflection) and are preferred for obtaining vector resolved magnetization measurements. One probe wavelength can be used at normal incidence to obtain the magneto-optical measurement of the magnetization perpendicular to sample surface, while a simultaneous probe pulse at a different wavelength and oblique incidence can be used to obtain the in-plane component of the magnetization. Pump and probe can have either normal or oblique incidence up to 80 degrees from normal.

A couple of different probe lasers can be used instead of one and each one can be used to either measure different magnetization components or one magnetic property and another thermal or mechanical property.

The pump and probe pulses may have different color wavelengths. However, while color separation is necessary for collinear pump and probe placed on the same side of the sample it is not mandatory for non-collinear beams (spatial pump filtering of the pump scattering toward detector can be used). Moreover, collinear beams incident from opposite sides of the sample can be used provided that the magnetic film thickness or supporting multilayers are significantly thicker than one of the pump/probe optical penetration depths. Of course, the large thickness of the supporting substrate needs to be transparent for the beam arriving from the back.

The pulse energy densities of the pump and probe pulses are less than 20 mJ/cm$^2$. Non-destructive evaluation requirement should limit the upper energy per unit area depending on the particular target material.

A magnetic field may be applied external to the target material during the steps of irradiating. This external field can be applied either parallel to the sample surface in any direction, or oblique or normal to the sample surface.

The above object and other objects, features, and advantages of the present invention are readily apparent from the following detailed description of the best mode for implementing the invention when taken in connection with the accompanying drawings.

BRIEF DESCRIPTION OF THE DRAWINGS

FIG. 5 illustrates a dual-laser magnetometer of another embodiment of the invention including an oblique incidence interferometer and variable inter-pulse temporal separation;

FIG. 6 illustrates a dual-laser magnetometer setup;

FIG. 10a illustrates a dual-laser magnetometer assembly of the dual-laser magnetometer with interferometer and collimation system;

FIG. 10c1 illustrates a collimator with two lenses of the dual-laser magnetometer with interferometer and collimation system;

FIG. 10c2 illustrates a collimator with two lenses and optical fiber of the dual-laser magnetometer with interferometer and collimation system;

DETAILED DESCRIPTION

With the newly developed method and system described here, magnetic and thermal measurements are facilitated over an unprecedentedly wide temporal range, up to 10 nsec in one embodiment of the invention, using 100 MHz repetition rate mode-locked lasers. Measurement capabilities at the very short, femtosecond, time scale are also achieved under optimal conditions, with a detection bandwidth of 6 THz, limited primarily by the duration of the probe pulse. This same system has been used to generate and detect coherent optical phonons in a number of materials including Sb and Bi.

The invention described here is motivated by a need to connect long and short time scales associated with the relevant excitation processes in epitaxial magnetic thin films. These include optically stimulated thermal transport, lattice and spin excitations. The ultrafast pump-probe system presented here is an ideal instrument to access the disparate time-scales of these coupled processes.

Figure 1:
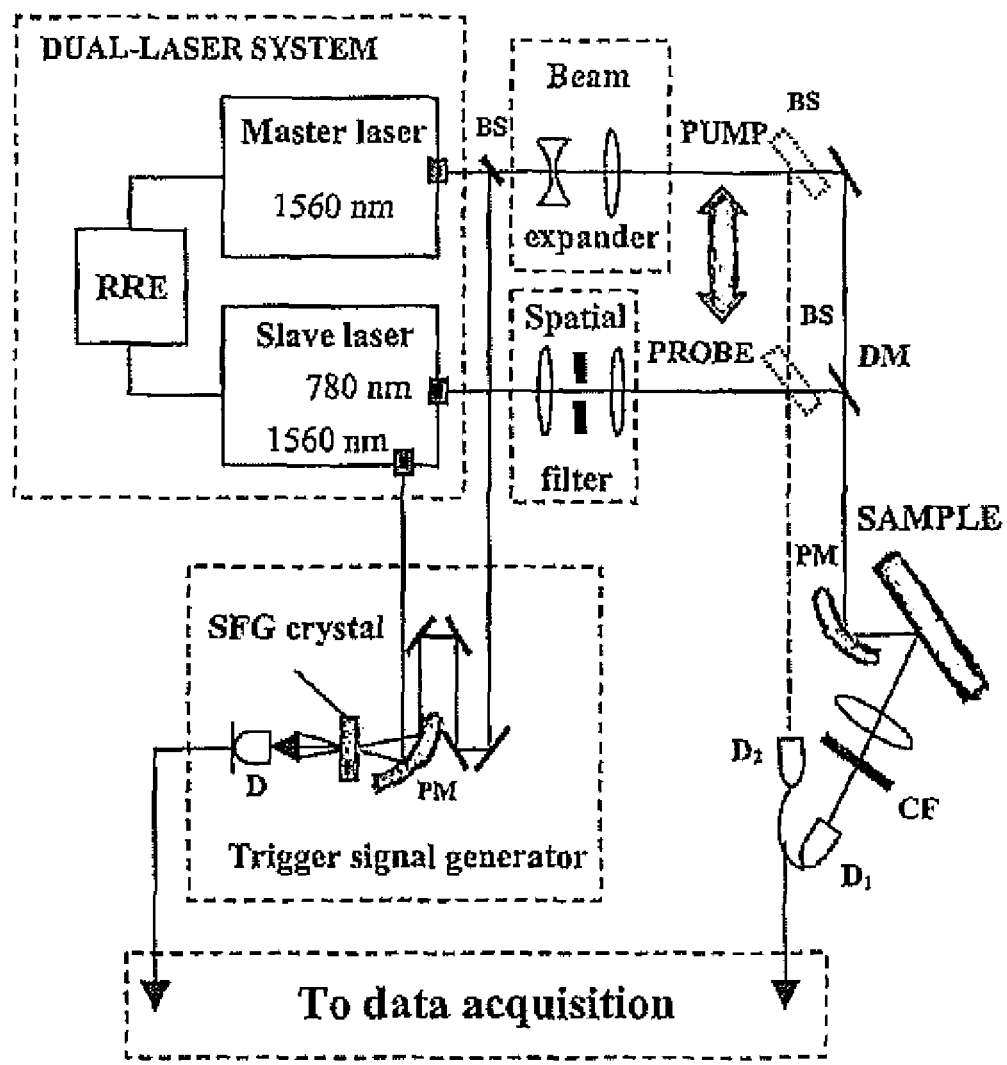
FIG. 1 is a schematic of the experimental setup with collinear pump-probe geometry: RRE—repetition-rate synchronization electronics; BS—beam splitter; DM—dichroic mirror; PM—parabolic mirror; CF—color filter; D, D1, D2—detectors; SFG—sum-frequency generation.

Multicolor (non-degenerate) pump-probe measurements were carried out using a specially designed dual-fiber-laser system from Menlo Systems GmbH [9]. A schematic of the experimental arrangement is shown in FIG. 1, including the dual-laser system, the electronic detection scheme and the optical components. The dual-laser system uses two separate passively mode-locked lasers based on Er-doped fiber, with each laser providing output pulses of 1.5 nJ energy and 80 fs duration at the fundamental wavelength of 1560 nm. The two lasers have slightly different repetition rates, with one laser (the slave) locked to the other (the master) with a fixed offset frequency. The slave laser is frequency doubled through second harmonic generation (SHG) to 780 nm wavelength, with pulse duration of 150 fs and 0.4 nJ energy. A residual beam at 520 nm corresponding to third harmonic generation (THG) is also available at a reduced level of <0.01 nJ. The SHG beam from the slave laser, was used mostly as the probe, while, in some cases, the THG can still be used for optical probing at a secondary wavelength.

Continuous scanning in the time-domain was achieved by stabilizing the repetition rate asynchronism (frequency difference) between the two mode-locked lasers. The individual laser repetition rates are close to 100 MHZ while being stabilized [9] to a small and constant difference repetition frequency, selectable between 0.2-7 kHz. The fixed rate difference between the pump and probe lasers ensures that a continuous variable time delay is realized [1-2, 6-9] between the two laser pulses. The maximum temporal scanning interval ($\tau_s$) is the time-interval between pump pulses, which is given by the inverse frequency of the master laser ($\tau s=1/f_1$). The temporal resolution is determined by the most significant of: the limited detector bandwidth, the laser pulse duration and the pulse-to-pulse jitter. The detector bandwidth contribution is taken into account through $\tau_b = \Delta f/f_1 B$ [8], where B is the effective bandwidth of the detection and corresponds to 50 MHZ in the present studies. A computer-based digital-oscilloscope with 100 MHZ analog bandwidth is used for data acquisition. The oscilloscope sampling rate corresponds to a 10 ns interval, which coincides with $1/f_1$ to provide direct conversion to $\tau_s$ in the experiment. Hence, with our experimental apparatus, the corresponding bandwidth limit to the time resolution varies from 40 fs to 10 nsec based on the accessible $\Delta f$ values provided by the dual-laser system. Depending on the particular measurement resolution requirements, a suitable value for $\Delta f$ was chosen during the experiment.

To optimize our temporal resolution and accomplish real time triggering during the data acquisition process, we have constructed an optical cross-correlator using a beam splitter derived portion from the master laser together with a residual beam at the fundamental wavelength from SHG unit of the slave laser. The two laser beams are focused by a 90 off-axis parabolic mirror on a beta barium borate (BBO) crystal to obtain a sum frequency generated (SFG) cross-correlation beam at 780 nm, monitored by an amplified photodiode with 150 MHZ analog bandwidth. The mirror-based focusing helped to increase the efficiency of SFG generation compared with lens-based focusing by eliminating chromatic aberrations to provide a better beam overlap inside the BBO crystal. The measured temporal width of the cross correlation signal is 160 fs.

Even with optical triggering, additional time-resolution constraints are imposed by the timing-jitter contribution of the dual-fiber-laser system that accumulates during the course of a measurement. To estimate the timing jitter, we have measured a second cross-correlation after a time delay of 10 ns between successive pump pulses. Comparing the first (160 fs) and the second (300 fs) cross-correlation widths, we determine that the timing jitter accumulates at a rate of ~15 fs for every nanosecond of time delay, following the trigger signal. To minimize the effects of timing jitter at short time delays, we carefully matched the travel distances of the optical beam paths of the pump and probe beams with the corresponding ones inside the cross-correlator. In this way, a maximum bandwidth of 6 THz could be reached, which was important in at least one embodiment for achieving the detection of coherent optical phonons in Sb and Bi. The optical phonon frequencies, measured at small pump power excitation levels, provided a successful test for the experimental setup calibration based on achieving agreement with the first-order Raman scattering results from [11].

The laser output beams were individually expanded to reduce beam divergence, while a dichroic mirror is used to direct, collinearly, two-color beams toward a parabolic mirror which focused them on the sample at an oblique angle of incidence of 30°. A 90° off-axis parabolic mirror was employed for eliminating the chromatic aberrations and to facilitate precise dual-color focusing overlap; this was necessary in at least one embodiment for achieving phase matching during the coherent excitation and probing. The pump and probe individual wavelengths could be interchanged by replacing the beam expander lenses for focusing to a spot size of about 10 µm or smaller, while maintaining a pump-probe spot size ratio of 2. A half-waveplate followed by a polarizer (not shown in FIG. 1) was placed into the probe optical beam path to adjust the pump-probe intensity ratio to a factor of 10-100. Changes in the time-dependent sample reflectivity are measured with an amplified differential photodetector. The difference between the reflected probe light and a reference derived from the incident probe light in two matched diodes, is amplified and the output is low-pass filtered to a 50 MHZ bandwidth to suppress the detection of the laser repetition rate signal at 100 MHZ.

The dual-laser ASOPS system, providing a large temporal dynamic range, is extremely advantageous in at least one embodiment for studies of samples in which several excitations are active over a wide range of time scales. Such is the case for epitaxial thin films of Fe deposited on MgO and Ge substrates. We illustrate the power of this approach through a series of transient reflectivity measurements to detect the thermoreflectance signal and coherent strain wave propagation, while coherent magnetization oscillations were probed with polarization analysis under an external magnetic field. Separation of the magneto-optical Kerr effect (MOKE) from non-magnetic contributions using the probe beam polarization is discussed in the following.

Magnetization dynamics can be observed by monitoring the oscillation frequency which is strongly dependent on the field strength. The external magnetic field was applied along the sample surface using a small permanent magnet with its pole axis placed parallel with the sample and perpendicular to the horizontal optical scattering plane. The permanent magnet enabled us to obtain measurements quickly and conveniently; however it should be pointed out that the magnetic field it produces is not spatially uniform and includes both in-plane and out-of-plane components, although it did not vary significantly across the measurement spot size of at most 10 µm. The permanent magnet provided a magnetic field strength of up to 0.25 T and its amplitude could be tuned by varying the magnet-to-sample separation distance. In at least one embodiment of the instrument, the permanent magnet is replaced by an electromagnet that can provide larger magnetic fields. For the case when the optical field of view needs to be accessible on the film side of a large scale wafer, a projected field magnet such GMW model 5201 (www.gmw.com) can be placed on the backside of the wafer in order to not obscure the optical field of view for optical probing on the front side. This type of magnet can be used to apply the magnetic field parallel, oblique or perpendicular to the thin film surface.

The detection of the magnetization dynamics could be made first without using an analyzer at all orientations of the probe beam polarization except for s-polarized light. This observation is consistent with the detection of transversal MOKE (Magneto-optic Kerr Effect) and eliminates secorid order MOKE effects that should be present for both s and p polarized light [12]. The detection of MOKE polarization rotation was done by inserting an analyzer in front of the detector at angles larger than 45° with respect to the incident beam polarization. When inserting an analyzer in front of the detector and gradually rotating it toward extinction, the isotropic reflectivity contribution to the signal is reduced, while the polarization rotation related to polar and longitudinal MOKE is more effectively measured. That is indeed what we observed, with improved sensitivity over the transversal MOKE detection. Separating the longitudinal and polar contributions was done by performing complementary measurements at s and p polarizations of the incident beam and with the analyzer at the intermediate angle of 45°. Taking into account that the polar MOKE does not change sign when changing the polarization of incident beam from s to p, while the longitudinal MOKE does, we have added and subtracted the two measurements to separate the two contributions. We note here that an optimal MOKE detection can be achieved using orthogonal polarization balancing based on polarizing beam splitters to eliminate the non-magnetic reflectivity signal contributions and reduce the measurement noise. However, using such an approach alone can in some cases mix true magnetic polarization rotations with anisotropic reflectivity changes related for instance to Raman-type scattering used for the detection of coherent optical phonons [13]. It is then necessary in at least one embodiment to perform appropriate separation of the measured signal component content for selecting the most favorable detection scheme.

Additional experimental details will be presented as we describe the results in the following sections. We emphasize here the efficiency of the ASOPS scanning as compared to mechanical scanning. The former is typically done at kilohertz rates, while fast mechanical delay lines are moving with speeds on the order of 0.5 m/s. Thus, the ASOPS scanning speed is at least four orders of magnitude larger than mechanical scanning for time delays approaching 10 ns.

Transient Thermoreflectance

The first example we present refers to transient thermoreflectance measurements performed on metallic layers grown on a single crystal substrate. This is where the unprecedented ability of our approach to connect long and short time regimes really comes into its own, enabling us to follow the thermal transport from the initial excitation to much later times corresponding to heat propagation deep in the substrate. Two epitaxial 70 nm thick Fe films were grown by molecular beam epitaxy (MBE) on (110) Ge and MgO substrates, and covered with a 4 nm overlayer of Au to protect the surface from oxidation under ambient exposure. The presence of the thin Au overlayer is assumed to be negligible in the following analysis. The metallic film thickness of Fe was chosen to be much larger than the laser probing depth, thus suppressing any contribution to the measured transient reflectance due to the direct optical excitation of the substrate. First, at short time delays (ps), the transient reflectance is dominated by the non-equilibrium excitation of a hot electron plasma near the thin film surface, which is rapidly thermalized through electron-phonon relaxation [14].

Figure 2:
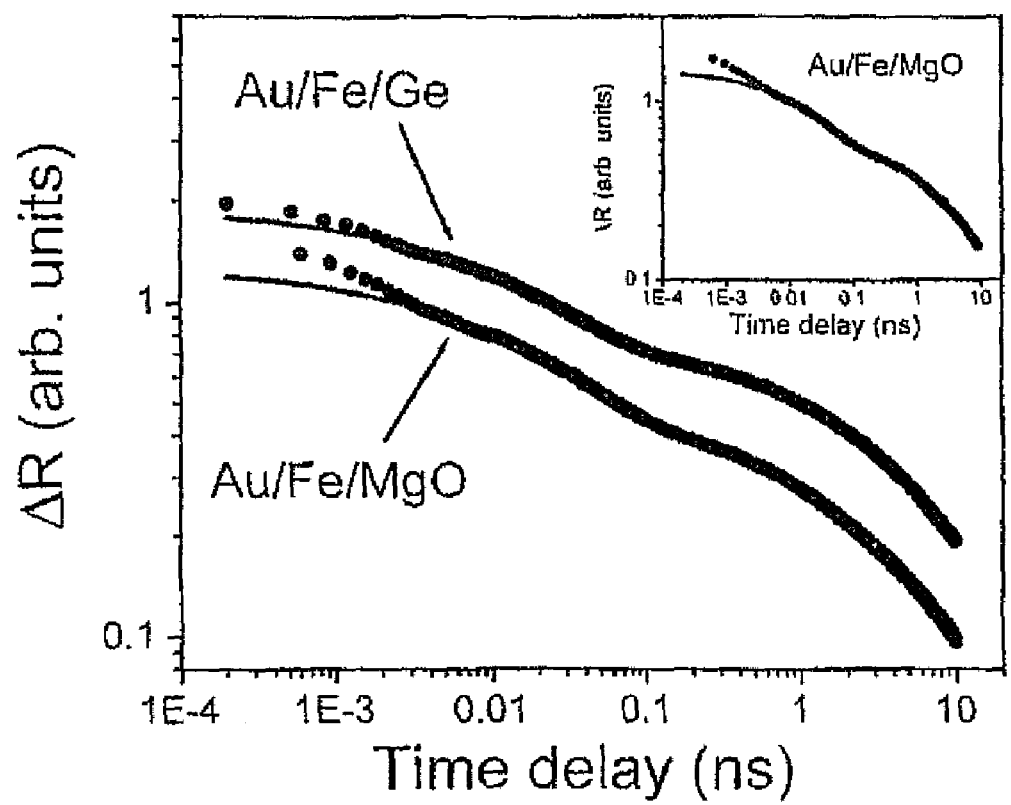
FIG. 2 illustrates thermoreflectance experimental data (fit curves) and are plotted as dots (lines); the curves are rescaled and displaced for clarity; fitting is done by fixing ks=42 W/km for Au/Fe/MgO and ks=60 W/km for Au/Fe/Ge; inset: fit corresponding to kf=43 W/km, sk=2.5×10$^8$ W/m$^2$K and adjustment of ks to 6 W/km (7 times less than bulk value)

FIG. 2 compares the thermal cooling curves following the pump pulse excitation at 1560 nm, plotted over the entire range of maximum time delay of 10 ns corresponding to the pump laser repetition rate. The analysis was focused on describing the later stages of cooling from the picosecond to nanosecond time scale, using a simple heat diffusion model proposed by Stevens et al. [15]. The heat diffusion model can be applied if the time constant of heat diffusion in film ($\tau_f$) and interface time constant ($\tau_i$) follows $\tau_f/\tau_i = d\, \sigma_k/k_f < 1$ (equation 10 in Ref. [15]), where d is the film thickness. If $\sigma_k \sim 10^8$ to $10^9$ W/m²K and $k_f$ is from a few tens to a few hundreds W/Km then d should be <100 nm, which verifies that d for our samples (70 nm) is within the desired range of this criterion.

A least squares minimization procedure was implemented to adjust the numerical solution of the heat diffusion equation, with appropriate boundary conditions, to the experimental data. In addition to film-substrate boundary conductance ($\tau_k$) and heat penetration depth ($\delta$) as free parameters, we also allow the film thermal conductivity ($k_f$) to be adjustable, while keeping specific heats and substrate thermal conductivity ($k_s$) at known values corresponding to the bulk material. A very good fit to the experimental data could be obtained for up to 3 ns of time delay for both samples, and the result is plotted in FIG. 2. A larger $\sigma_k$ of $2.5 \times 10^8$ W/m²K is obtained for the Fe/MgO interface compared with $2.1 \times 10^8$ W/m²K corresponding to the Fe/Ge interface. This is the reason why the cooling takes place faster on the MgO rather than Ge substrate between 100 ps and 3 ns. The relatively large boundary conductance $\sigma_k$ reported here and compared with the data from [15] obtained for other film/substrate combinations, could be the result of a smaller acoustic mismatch for the case of our samples. The reflection coefficients $R_k$ are calculated in the acoustic mismatch limit [16], based on the known bulk values for sound velocity and mass density. $R_k$ values of 2.7% and 6.8% are then calculated for the Fe/MgO (110) and Fe/Ge (110) interfaces, respectively. The smaller acoustic mismatch calculated for the Fe/MgO interface correlates well with the larger $\sigma_k$ measurement. Additionally, we note that the film/substrate combinations used in the present study have relative sound velocities and Debye temperatures that are reasonably matched within less than a factor of 2, enabling efficient phonon transmission across the interface [16]. Accordingly, a relatively large $\sigma_k$ is expected for our samples in agreement with the experimental results.

On the shorter time scale the cooling slopes are similar and given by $k_f$ values of 33 and 46 W/Km, corresponding to the Fe/MgO and Fe/Ge thin films respectively. As expected [17] for thin films, the values of the thermal conductivity are smaller than the one corresponding to the bulk material. The obtained $\delta$ values of 18-22 nm are very close to the optical penetration depth at the 1560 nm wavelength for the bulk iron. Although we have fitted the experimental data starting from 10 ps after the pump pulse excitation, good agreement with the thermal diffusion model was found down to 3 ps of time delay after the initial excitation, indicating that the electron-phonon relaxation is already completed during the first 3 ps.

Alternative analyses of the cooling curves over the whole range of 10 ns time delay, leaving the substrate thermal conductivities ($k_s$) as free parameters (similar to references [15-16]), returned values that were a factor of 7 to 12 smaller than the bulk values with the $k_f$ and $\sigma_k$ values increased by up to 40%, indicating a strong correlation between $k_s$ and the other free parameters. While this procedure corresponds to a more complete fit of the experimental curve over the entire pump-probe delay (FIG. 2 inset), the unreasonably low substrate thermal conductivity is evidence that the model does not take other thermal effects into account correctly. In particular, two missing ingredients from the adopted thermal model [15] are the thermally accumulated background produced by repetitive excitation, and the lateral heat flow. The former contribution suggests that the small slope of the spatial profile of the accumulated thermal background cannot be neglected when trying to understanding the cooling at long time delays. In our experiments, it is observed that the average measured background reflectivity, defined as the pump-induced reflectivity change at the immediate instant just before the pump excitation, is about half of the transient thermoreflectance signal. Consequently, the heat accumulation effects produced by repetitive pulse excitation at 100 MHZ are expected to play an appreciable role for the long time delays where the transient thermoreflectance has decreased to low levels.

Coherent Strain Wave Propagation

Figure 3:
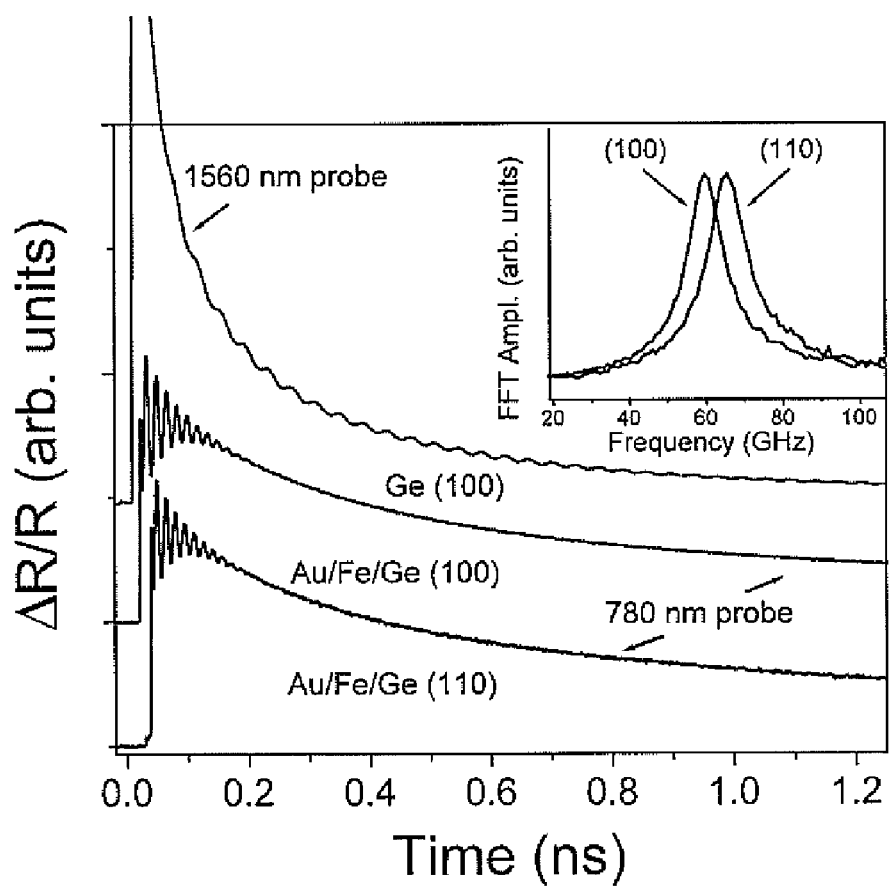
FIG. 3 illustrates experimental transient reflectivity in the upper curve (two lower curves) and is measured using 780 nm (1560 nm) pump wavelength; the curves are rescaled and displaced for clarity; FFT in the inset corresponds to the oscillatory part of the signal for the two lower experimental curves.

Ultrashort laser pulses can also excite coherent uniaxial strain waves propagating perpendicular to the sample surface toward the bulk [18]. Such strain waves can be detected via oscillatory contributions of the transient reflectivity with frequency equal to $2n v \cos(\theta)/\lambda$, where v is the speed of sound, n is the index of refraction at the wavelength $\lambda$, and $\theta$ is the angle of incidence inside the probed material. To probe the bulk strain wave propagation after surface excitation, we have used either bare Ge substrates or 10-15 nm Fe epitaxial films deposited on (100) and (110) Ge substrates and covered with Au overlayers. Systematic investigations were performed by switching the individual pump and probe wavelengths. In FIG. 3 we compare an experimental curve obtained on a 10 nm Fe film grown on (100) Ge substrate that is probed at 780 nm wavelength, with a measurement on a bare (100) Ge wafer when probing at the complementary wavelength of 1560 nm.

A long oscillation on the nanosecond time scale can be probed with 1560 nm wavelength on the bare (100) Ge. We attribute the detection enhancement of the photoacoustic contribution to a resonant condition for probing at the direct bandgap absorption edge, as was seen previously for the case of GaSb—GaAs heterostructures [19]. In the case of non-resonant probing at 780 nm, the presence of a thin absorptive Fe film at the 1560 nm pump wavelength permitted partial optical transmission of the probe in Ge for observing the bulk strain propagation. In the short lived oscillation curves in FIG. 3 corresponding to such thin Fe films deposited on Ge substrates, we observe that changing the probing wavelength to 780 nm rapidly reduces the amplitude of the signal when the strain wave propagates deep into the substrate. Such behavior could be explained based on the shorter optical penetration depth in Ge at 780 nm compared with the one at 1560 nm. The reflectivity oscillations are still clearly visible up to 200 ps, enabling an accurate sound velocity determination.

An even more drastic increase of the oscillation amplitude decay occurs when probing at a wavelength of 520 nm, consistent with a corresponding large increase of wavelength dependent absorption [20]. The inset from FIG. 3 compares two fast-Fourier-transform (FFT) spectra of the oscillatory part of time resolved spectra, measured with a 780 nm probe on 10 to 15 nm thick iron films grown on (100) and (110) Ge substrates. Using the peak frequencies and 4.74 for the index of refraction [20], we obtain 4.96 and 5.43 km/s for the longitudinal sound velocity along the [100] and [110] crystallographic directions, respectively, in excellent agreement with the earlier published data for crystalline Ge [21].

When measuring at the complementary probe wavelength (520 nm), it is observed that the reflectivity oscillation frequency increased by about 52% when replacing 780 nm with 520 nm for the probe (not shown in FIG. 3). This result confirms that the corresponding increase of $2n v \cos(\theta)/\lambda$, is in agreement with the above determination of v and the prior index of refraction measurement at 520 nm [20]. We note here that the wavelength dependent detection studies could be used to obtain both ν and the index of refraction.

Coherent Magnetization Oscillations

The detection of coherent magnetization oscillations excited by ultrafast optical pulses, based on mechanical time-delay scanning, was previously reported in samples comprising of antiferromagnet-ferromagnet coupled layers [22] or ferromagnetic metallic layers [23, 24]. The measured oscillation frequencies can be related to magnetic anisotropy contributions, saturation magnetization, and exchange interaction. Such studies are usually limited to time delays of around 1 ns, being susceptible to errors related to spot size variations and pointing instabilities present during the mechanical scanning. In at least one embodiment of our invention we apply all-optical pump-probe techniques combined with fast ASOPS scanning to the measurements of magnetic damping phenomena extended here to long time delays while reducing the measurement errors.

A simple estimate for the oscillation amplitude decay time can be made using $\tau=1/2\pi f\alpha$, where $\tau$ is the exponential decay time, $\alpha$ is the intrinsic Gilbert damping rate, and f is the resonant frequency. Such an expression is valid when applying large magnetic fields perpendicular to the sample surface. When choosing a resonant frequency of 20 GHz, and considering the value for $\alpha$ reported for high quality Fe and FeCo alloys [25], one would expect a relaxation time of around 4 ns. Thus, extending the time delay for accurate measurements of intrinsic Gilbert damping is highly desirable in at least one embodiment.

Figure 4:
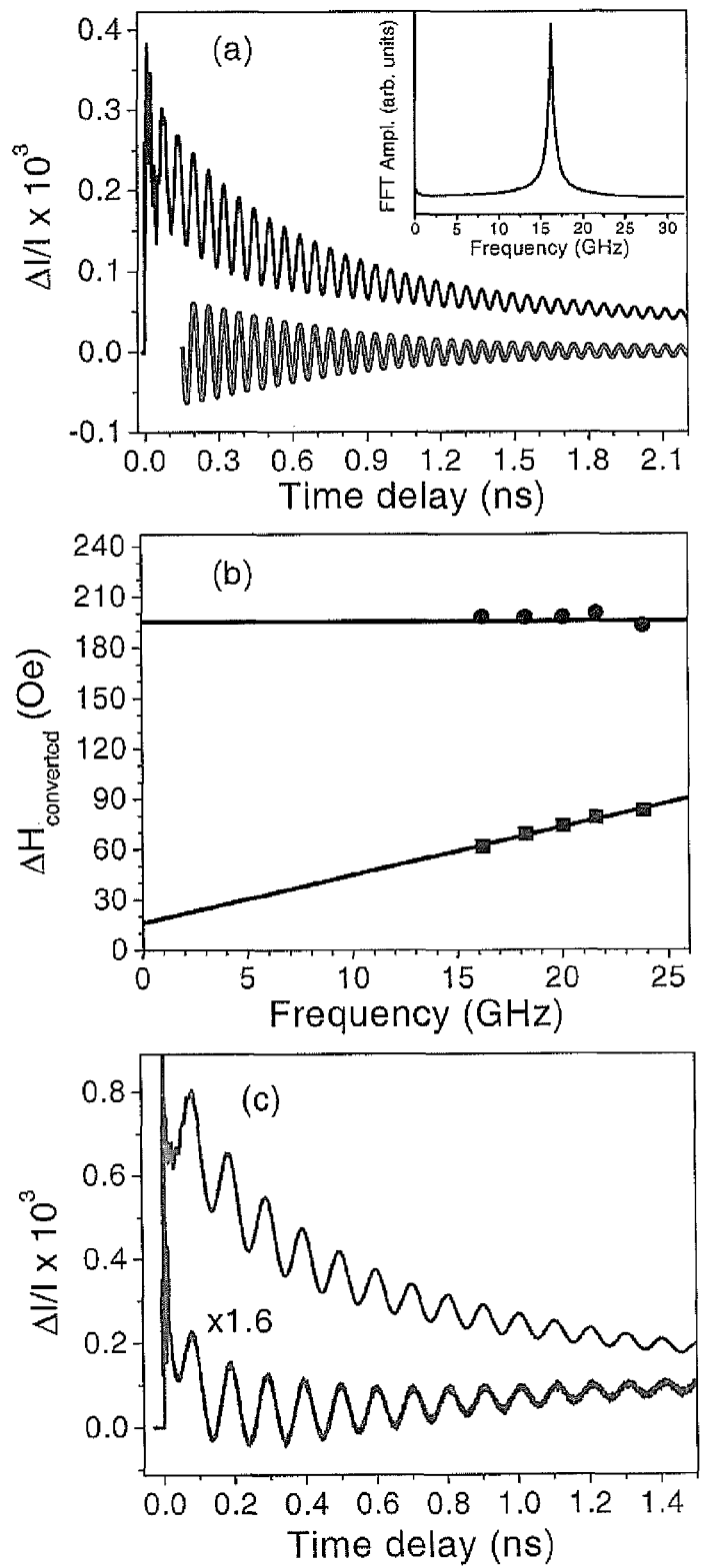
FIG. 4 illustrates the coherent magnetization oscillation measurement result and is shown in (a), the lower dotted curve is the experiment (fit) after background subtraction; (b) equivalent magnetic field linewidth values are plotted as dots, the lower line is a fit and the upper line is a guide to the eye; (c) shows a comparison of the experimental results obtained at 780 nm and 520 nm probe wavelengths in the upper and lower curves respectively.

An experimental curve of the coherent magnetization oscillations, measured using our approach is shown in FIG. 4(a). The measurement is performed on a 15 nm epitaxial iron film sample (overcoated with 4 nm of Au) grown by UHV evaporation on a (110) Ge substrate. An external magnetic field of about 0.15 T was applied close to the in-plane easy axis, while an analyzer was placed in front of the detector at an angle of 750 with respect to the probe beam polarization. Long-lived coherent magnetization oscillations can be resolved for time delays of up to 9 ns, although only the first 2 ns are displayed in the plots shown in FIG. 4(a). After extracting the non-coherent background contribution to the signal, it is observed that the peak-to-peak oscillation period has a small time-delay dependency and does not exhibit a single exponential decay. In principle, such an observation may result from the time varying thermal gradients that were specifically measured by the instrument. We employed a simple linear superposition of two exponentially damped cosine modes to model our data. A fit result is included in FIG. 4(a) and shows complete agreement with experiment. The data from the first 150 ps were excluded from the fit in order to eliminate the portion of the experimental curve that contains the acoustic signal. The fit, which extends to 6 ns of time delay, reveals a large contribution from a stronger mode decaying with a time constant of about 0.9 ns together with a ~3× weaker contribution from a faster decaying mode with 0.55 ns relaxation time. The relative phase shift between the two modes is found to be $\pi/2\pm15\%$, and demonstrates that the two modes involve dynamics with orthogonal magnetization components. The two modes have slightly different frequencies separated by a 1-2% of relative frequency shift with the faster decaying mode corresponding to the larger frequency.

It should be emphasized that the FFT of the data, shown in the inset from FIG. 4(a), cannot easily identify a dual contribution from closely spaced modes, while time-domain data analysis can separate them using their individual phases. For a fixed spot on the sample, we have varied the magnetic field strength to obtain the frequency dependence of individual mode decay times, for oscillation frequencies between 15 and 25 GHz. The larger frequency dependence is observed for the more intense mode, which corresponds to spin precession around the in-plane magnetic field direction. Due to the relatively weak frequency dependence of the decay time and the relative phase shift of $\pi/2$, this mode could be related to either the precession around the out-of-plane magnetic field component, which was present in our measurements, or with some particular sample non-uniformities that could enhance the local spin precession damping.

To compare the performance of our invention with prior experiments using ferromagnetic-resonance (FMR) spectroscopy, the following frequency expression is considered, obtained from the Landau-Lifshitz equation [26]:

$$\left(\frac{2\pi f}{\gamma}\right)^2 = [H\cos(\theta_M - \theta_H) + H_{k1}][H\cos(\theta_M - \theta_H) + H_{k2} + 4\pi M_{eff}] \quad (1)$$

where f is the precession frequency, $\gamma$ is the gyromagnetic ratio, H is the external magnetic field applied parallel to the sample plane, $\theta_M$ is the magnetization orientation angle, $\theta_H$ is the angle of the external field orientation, $H_{k1}$ and $H_{k2}$ represent the magnetocrystalline anisotropies that are specific to the sample orientation and include additional anisotropies characteristic of very thin films [26], and Meff represents the average magnetization value that can deviate from the bulk value and includes the out-of-plane uniaxial anisotropy. This frequency expression is valid for uniform spin precession around the in-plane magnetic field and neglects exchange interaction contributions related to either the surface anisotropy or to the presence of standing spin-wave modes. The exchange interaction can be considered by adding $Dq^2$ to both $H_{k1}$ and $H_{k2}$ from equation (1), where D is the spin stiffness and q is the spin-wave wavevector.

A connection between the frequency-swept linewidth and the field-swept linewidth is provided in [27] and can be deduced by differentiation of Equation (1) with respect to the external field value:

$$\Delta f = \frac{\gamma}{2\pi}\Delta H\sqrt{1 + \left(\frac{\gamma M}{f}\right)^2} \quad (2)$$

where $\Delta H$ takes the following form when a Lorentzian lineshape is assumed in the frequency domain:

$$\Delta H = \Delta H_i + \frac{2}{\sqrt{3}}\frac{2\pi f}{\gamma}\alpha \quad (3)$$

$\Delta H_i$ includes the contribution from inhomogenous broadening. The connection between the decay time $\tau$ and $\Delta f$ is given by the equation:

$$\Delta f = \frac{1}{\pi\tau}. \quad (4)$$

We can now convert the measured decay times into equivalent magnetic field linewidth values that are often used in FMR for determination of intrinsic damping and inhomogeneous broadening. The result for a few measured frequencies is plotted in FIG. 4(b) for the primary mode precession around the effective magnetic field direction. From the linear dependence of the converted ΔH values versus frequency and equation (3), we obtain $\Delta H_i = 16$ Oe and a linear slope of 2.85 Oe/GHz. We find reasonable agreement (16% smaller linear slope and 2×larger $\Delta H_i$) between our results and prior data [29] obtained using FMR and a Fe/GaAs (110) sample with 20 nm thickness.

The short optical penetration depths in metals can be used to reveal the presence of spin-wave modes dominated by exchange interaction by performing wavelength dependent studies with the three-color capabilities of the apparatus described here. The optical penetration depth ξ is wavelength dependent and is calculated using $\xi = \lambda/4\pi k$, where λ is the optical wavelength and k is the known imaginary part of the index of refraction [30]. At the probing wavelengths of 780 and 520 nm, the corresponding ξ are 19 and 14 nm, respectively. 780 nm with 520 nm probing in FIG. 4(c) was compared with all the other experimental conditions kept unchanged. It is observed that the oscillation frequency and phase remain the same when probing at both wavelengths. This result rules out the possibility of detecting the propagating dipolar surface modes of Damon-Eshbach (DE) type [31], which are accompanied by a frequency shift in Brillouin light scattering (BLS) detection [32] related to the incident photon wavevector changes. The BLS observation of such propagating DE modes is regularly made in backscattering geometry [33] with enough transit time for the spin-waves to propagate in and out of the probing region. The characteristic BLS frequency shifts associated with the probe wavelength changes are not observed in our measurements because the lateral propagation of the dipolar DE modes out of the probing region takes longer than the timescales explored in the present study. For our experiments, it is rather expected that detection of non-propagating spin-wave modes that are dominated by exchange interaction under the presence of surface anisotropy [34], is a possibility. Non-homogenous spin dynamics with a spatially dependent profile perpendicular to the sample surface is characteristic for such modes. When using the ASOPS system, the relative mode intensities measured at the 780 and 520 nm wavelengths could be employed to test the model assumptions about the spin-wave mode spatial profile and identify strong surface contributions. For instance, we would expect that a confined surface mode can be more easily identified when comparing 780 nm with 520 nm probing, due to the different depth sensitivity. A full MOKE spectrum covering both wavelengths is not available for our particular sample, although we have normalized the data to the relative MOKE strength for bulk Fe [35]. After the normalization, it is observed (FIG. 4(c)) that the oscillation amplitude is very similar for both probing wavelengths, suggesting that uniform spin precession takes place with equation (1) being satisfied.

The detection techniques presently described can be extended to the measurement of standing spin-wave modes that were observed in thicker Fe films using ASOPS time-delay scanning, or to new studies of nanostructured magnetic samples [36] as well as the interlayer exchange coupling present [37] in multilayered magnetic thin films.

SUMMARY OF PERFORMANCE EXAMPLES

Non-degenerate optical pump-probe spectroscopy in collinear geometry, based on the ASOPS technique and a dual-fiber-laser system, provides an effective tool for measuring the transient solid-state dynamics, spanning over almost five orders in magnitude of temporal dynamic range. The need of connecting extended timescales for monitoring different types of excitation is thus realized in practice. Several such applications for slow relaxation measurements were demonstrated such as the thermal transport across interfaces and the study of long-lived coherent oscillations corresponding to coherent acoustic and magnetic excitations. Further studies are enabled and could include: the coherent control of spin and phonon dynamics; the separation of intrinsic damping and inhomogeneous broadening in magnetic materials; more accurate measurements of heat and charge transport; and measurements of acoustic phonon propagation at extended depths into the material.

Based on inexpensive detector availability, a range from 320 to 1700 nm (3.9 to 0.73 eV) can be used for possible laser wavelength for metallic layers that are generally well absorbing in this region.

For semiconductor layers or supporting substrates, it is convenient to choose wavelengths from the above interval to: a) suppress their measurement contribution using below bandgap energies; and b) enhance their measurement contribution using energies matched to bandgap resonances or simply using above the bandgap probing.

Available wavelengths depend also on the laser choice. Inexpensive and compact ultrafast lasers can provide specific fixed or slightly variable wavelengths covering 380-1550 nm (typical wavelength examples: 390, 520, 780, 1040, 1550 nm).

At least one wavelength is of course required in at least one embodiment, while it is convenient to use different wavelengths for the pump and probe. Additionally, using two or more wavelengths for pumping or probing can help to extract useful measurement contribution content.

Small pulse widths (usually more expensive) help in increasing the temporal resolution or the excitation efficiency. Longer (cheaper) pulses can still be used to perform thermomagnetic characterization or complementary magnetic hysteresis using a multifunctional instrument. For instance, in a real time scheme, a multi-beam geometry (using multiple probes) can be used to detect the magnetic signal at complimentary wavelengths or to combine magnetic with thermoacoustic characterization using different detectors and color filters/dichroic mirrors. This last multifunctional feature to solve for complementary sample parameters can be very advantageous in at least one embodiment. In view of the above, <10 ps is preferred for coherent probing on the picosecond scale while <100 ps is performed in at least one embodiment for slow relaxation probing on the nanosecond scale. Optimal performance is usually achieved in the 50 fs-1 ps range.

Adding controlled pulse shaping to the pump beam can enhance the sensitivity. Dual pump pulse excitation (separated by a temporal delay that corresponds to resonant coherent excitation) will enhance the sensitivity also. Description of dual probe pulse interferometry to enhance sensitivity is described here as at least one embodiment of the invention. While Gaussian pulse shape may be used, triangular, rectangular or square pulse shapes can also be used.

Tight focus for the probe is always convenient to improve the spatial resolution, while small pump beam focusing makes a better use of the laser power. On the other hand, focusing the pump beam tightly can produce pump/probe spot non-uniformities, generating relaxation mechanisms that are more difficult to interpret. Tight probe focusing can sometimes generate depolarization that is disadvantageous for performing magneto-optical measurements. A range of possible focused laser spot sizes and shapes is 0.4-40 microns, depending on the temporal delay of interest, laser type and wavelength used. Optimal range for the probe is from 0.5 microns to less than pump size. Achieving tight focus is usually easier with Gaussian shapes. Circular, elliptical, rectangular or square beam shapes are examples used in other embodiments.

A small pump power (energy per pulse) can be tolerated when using tight focusing. Large pump power can make the data analysis more difficult. For example, a pump spot size of 6-10 microns and 3-10 microns probe spot size with pump laser powers down to 10 mW and up to 100 mW has been used in one embodiment. The pump laser can have <1 watt in power and <10 ns per pulse, depending on the focusing condition and the need to prevent sample damage. The probe laser can have powers of up to ten times the detector saturation level in a dual photodiode balanced mode (typical detector powers: 1 nW-1mW).

Using larger repetition rates is convenient for improving the temporal resolution and the rate of scanning while it can generate limitations on the maximum pump laser power (to prevent damage via heat accumulation) and sometimes do not provide enough time delay for relaxation before subsequent pulse excitation is repeated. Using smaller repetition rates can maximize the pump pulse excitation efficiency while reducing the average power to a convenient level below sample damage. In view of the above, a range of possible repetition rates is 10 MHZ-2 GHz depending on the measurement application. An optimal range is 50-250 MHZ which coincides with the range for relatively inexpensive and compact fiber lasers.

A preferred embodiment of the dual pulse interferometry of Sagnac type features common path optical trajectory at oblique incidence for pulse pairs of orthogonal polarization derived from both pump and probe lasers of different wavelengths. A drawing that contains a schematic of this embodiment can be found in FIG. 5. The polarization of the output pulse from the pump laser is selected first with a waveplate (WP2) and a dichroic mirror (DM) directs the pump pulse toward the polarizing beamsplitter (PBS1) that is placed at the input of the common path interferometer. The relative ratio of the two orthogonally polarized pulses that travel along the two interferometer arms is selected using WP2. A mechanical delay stage that contains a mirror retroreflector is placed along one of the two interferometer arms that ensures that the corresponding part of the pump pulse is time delayed with respect to the other pulse traveling in opposite direction along the second interferometer arm. The arrival time at the sample location, focused by lenses (or focusing mirrors) L1 and L2, of these pair of pump pulse is selected with MSR by tuning their interpulse time delay to the exact period for an allowed magnetic oscillation frequency of interest in the sample studied. This type of dual pulse excitation assures that the magnetic excitation is resonantly enhanced. Similarly, to the pump pair of pulse, a probe pair of pulses a different wavelength is generated at the same PBS1 after a portion of the probe pulse is transmitted through a non-polarizing beam splitter (NPBS) and the DM. The waveplate (WP1) is used to control the amplitude ratio of the probe pulse pair that are sent inside the interferometer. As in the case of pump pulse par, the probe pulse pair temporal separation is matching the period of magnetic oscillation of interest for enhancing the sensitivity in the detection process. The returning probe pulses travel identical beampaths inside the interferometer and return to NBS through PBS1. The probe pulse pair is recombined spatially and temporally after returning through PBS1 to later benefit from the interferometric detection. The interferometric detection is realized after the recombined probe beam has passed through PBS2. The waveplate (WP5) balances the amount of light received by detectors D1 and D2 by controlling the transmission of the recombined probe beam through polarizing beamsplitter PBS2. This detection scheme assures that the MOKE polarization rotation associated with the excited magnetic oscillations is optimally detected. The interferometer design permits to control separately the pair of probe pulses inside and at the detection arm of the interferometer by providing relative intensity control with rotation of WP1, relative interpulse phase control using MSR and polarization control using waveplates WP3 and WP4. The pulse intensity, phase and polarization control is further used to optimize the detection sensitivity for particular magnetic measurement situations, by maximizing the sensitivity of the interferometric signal detection. This modified version of Sagnac interferometry is beneficial because it eliminates noise related to mechanical vibrations, thermal fluctuations and linear birefringence due to imperfections in various optical components as well as the sample itself. Since all these signals of non-magnetic origin are eliminated from the measurement then the noise characteristics of the magnetic characterization is improved. Beyond optimizing the sensitivity for the thin layer measurement, the technique from described here is used to separate in the measurement the magnetic dynamics from a particular component layer from a multi-layer stack, since detection selectivity is assured during the stage of phase selectivity realized by the use of MSR.

An alternate version for the case when the pump and probe wavelengths are chose to be the same is also shown in FIG. 5. The pump beam is directed to the sample and overlapped with the spot of probe pulses by using mirror M3 instead of DM, scheme that assures that spatial separation of the pump from the probe is realized during the detection.

In another operation mode of the interferometer, a small MOKE polarization rotation derived from the probe pulse pair that exit from the interferometer at the dotted line from PBS1 in FIG. 5 (in this case the polarization balancing at PBS1 is replaced sampling only with D2 and balancing with the small MOKE polarization rotation).

Appendix A

Description
  1) General Purpose

A new invention, consisting of an optical magnetometer based on ultrafast-pulsed laser technique, is disclosed. The new design of the ultrafast optical magnetometer will enable the characterization of magnetic materials and related devices during their manufacturing by providing a feedback for the production processes. The methods and techniques described here could be adapted for either the needs of research and development, or for the in-line implementation of the magneto-optical metrology. Industrial large-scale magnetic device manufacturers of magnetic random access memories (MRAM) or magnetic thin film sensors are the potential users of the invention.

The ultrafast optical magnetometer measurement scheme and its advantages are presented in Sections 2 and 3. The magnetic parameters of interest that could be extracted from the output of the ultrafast optical magnetometer include: magnetic moment, magnetic anisotropy, magnetic exchange interaction in a single or multi layer, magnetic interlayer coupling, magnetic structure variations/imperfections at the multi-layers interfaces, and time-resolved relaxation and switching rates.

Additional instrument functions beyond the basic magnetometer functionality will be described in Section 4. One additional function is the measurement of the thin film thickness performed simultaneously with magnetic spectra acquisition. A further instrument function capability includes the use of the magnetic second-harmonic generation (MSHG) or magnetic third-harmonic generation (MTHG) at the interface/surface for assessing the magnetic properties at interfaces of thin films by excluding the bulk contributions. Yet another measurement scheme is proposed for the measurement of optical-spin resonance in paramagnetic solids or liquid-state materials.

2) Technical Description a) Basic Description of the Ultrafast Optical Magnetometer Our ultrafast optical magnetometry technique is used for the measurement of magnetic properties by combining the ultrafast pulse excitation of magnetization/spin dynamics with magneto-optical probing of the time-dependent magnetization dynamics. Two laser beams are used from two independent ultrafast lasers, with one being a larger-intensity pump, and the other being a weaker-intensity probe. The two beams are focused on the sample surface to spot sizes of a few micrometers, while being also spatially overlapped. The time interval across which the magnetization/spin dynamics evolves could be probed in the range from femtoseconds to nanosecond time intervals. The detection method uses a time-delayed optical probe pulse from a second laser for phase sensitive measurements that are directly proportional with the magnetization/spin dynamics. A drawing of the basic magnetometer geometry can be found in FIG. 6. The laser-probe detection is implemented at an oblique angle of incidence, which is suitable for probing the real time magnetization/spin dynamics of in-plane magnetized samples. Alternatively, normal incidence geometry can be chosen for measurements of the out-of-plane magnetized samples. A dual balanced detector could be used for measurements of the laser-probe phase changes proportional to the magnetization/spin dynamics. The measurement utilizes the phase difference between the orthogonal polarization components to extract the magnetic signal contribution. The two polarization components are balanced on the diodes of the dual detector using either a half or quarter waveplate placed before a polarization beam splitter. The coherent oscillations of the magnetization/spin dynamics and the associated time decays are detected through the measurements of the light polarization changes (rotation or ellipticity) based on the magneto-optical Kerr effect (MOKE).

Figure 7:
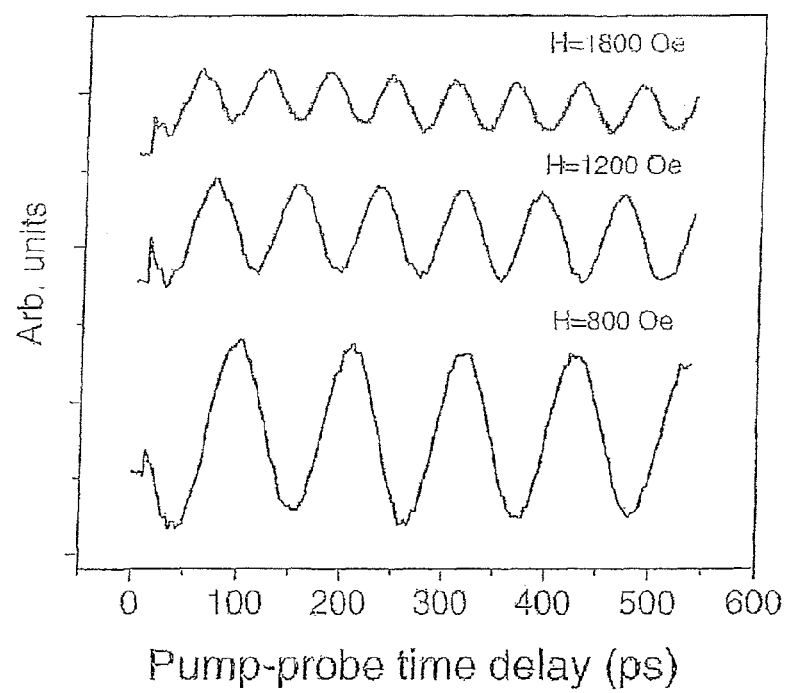
FIG. 7 illustrates magnetization/spin dynamics oscillations showing the increase in frequency at higher magnetic fields.

Several plots showing the measured magnetization/spin dynamics as a function of time elapsed from the pump laser excitation are illustrated in FIG. 7, featuring the magnetic field effect on the period of the measured oscillations. The measurements were done using a single laser with its output beam split into the pump and the probe parts. The dual detection scheme described above was employed for measuring the time resolved magnetization/spin dynamics. The time delay was realized by mechanical movement of a mirror based retroreflector to ensure a variable beam path difference between the pump and probe pulses at a scanning speed of less that 0.1 Hz. Although the magnetometer described under the present application could employ a similar detection scheme for the time-resolved magnetometry, as will be described later in the Section 2 b, a much more efficient temporal scanning technique can be used for the measurements of time resolved magnetization/spin dynamics spectra over nanosecond delay times and at very fast speeds. This technique uses two-phase locked lasers, as will be described below.

The acquisition of the time-domain spectra could be done by varying the sample/wafer orientation while keeping the measurement spot, magnetic field magnitude and its orientation fixed. To access different measurement spots across the sample/wafer surface, an off center sample/wafer rotation stage could be employed that keeps the measured spot on the center of the rotation stage while its relative position can be changed by lateral translation anywhere across the sample/wafer surface. When choosing a particular sample/wafer orientation with the respect to the direction of magnetic field, additional spectra could be acquired as a function of the magnetic field amplitude. Yet additional spectra could be acquired as function of the pump laser power when keeping the magnetic field magnitude and orientation fixed. The laser power induced changes to the sample magnetic properties could be used to compare the material property variations across the sample surface.

With the methods described herein, the magnetic sample inspection could be performed with the sample being placed inside a vacuum chamber, which would be suitable for the material production control, as well as, the research studies in an ultraclean environment safe from contamination. The external magnetic field can be applied from the back side of the sample to clear the field of view on the sample observation side, which allows an easy optical access, necessary in at least one embodiment for the measurements on very large area samples or films grown on large wafers.

The extraction of magnetic parameters from the measured time resolved spectra has been performed using the prior developed formalism (see for example J. Smit and H. G. Beljers, Philips Res. Rep. 10, 113, 1955) for ferromagnetic resonance (FMR) studies.

Contributions to the magnetic anisotropy energy are included depending on the particular sample to calculate the effective field as a sum of the external applied field and the intrinsic sample anisotropy field:

$$\vec{H}_{eff} = \vec{H}_{applied} + \vec{H}_{anisotropy}. \tag{1}$$

Then the measured resonance frequency is calculated from the second order derivatives of the magnetic anisotropy energy:

$$\omega_{res} = \gamma H_{eff} = \frac{\gamma}{M\sin\theta}[F_{\theta\theta}F_{\phi\phi} - F_{\theta\phi}^2]^{1/2}. \tag{2}$$

The calculated values are compared to the experimental results to extract the sample magnetic parameters.

In one embodiment, two contributions to the magnetic anisotropy energy (magnetocrystalline energy and magnetoelastic energy) are modified by adjusting the pump laser. This changes the temperature in thin magnetic film that can be further raised to arbitrary levels below thresholds for material damage to determine the temperature dependency of magnetocrystalline anisotropy by using equation (2) and the measurement result. In addition, for thin films with about 10 nm thickness, typical pump laser excitation fluence of near 1 mJ/cm$^2$ will induce strains in the film on the order of 0.1% and higher. This level of strain, which is relaxing at the cooling rate determined by thermal characteristics of the sample (these are measured separately using a thermoreflectance probe), transiently modifies the magnetic anisotropy and is measured as a change in $\omega_{res}$ and permits the determination of the magnetoelastic properties of the sample.

Using the present invention, the magnetization oscillation frequencies or their time-dependent relaxation provides sufficient information for magnetic parameters extraction in absolute units without the need of complicated calibration procedures for the measured amplitudes or intensities. As already mentioned in the Section 1, the parameters of interest include, but are not limited, to the quantitative measurements of the magnetic moment, magnetic anisotropy, magnetic exchange interaction in a single or multi layer, magnetic interlayer coupling and magnetic structure variations/imperfections at the interlayer interfaces.

b) Description of the Dual Laser Optical Sampling for Ultrafast Time-Resolved Magnetometry and Preliminary Data A dual ultrafast laser synchronization scheme is described to enable very fast and sensitive measurements for the magneto-optical pump and probe magnetometry. The two independent lasers have their ultrafast pulses synchronized in phase, and are used to perform the time-resolved pump and probe measurements. The synchronization scheme keeps the lasers at a different repetition frequency that is inversely proportional to the time required for the acquisition of a single-time domain spectra, an indicative of the magnetic properties of the sample. Polarization or phase resolved pump and probe spectroscopy for magnetometry employing two independent ultrafast pulsed lasers will enable the usage of kilohertz scanning rates for the data acquisition of time resolved magnetization/spin dynamics spectra. Having enough time between two successive pump excitations (or the inverse of the laser repetition rate) will be necessary in at least one embodiment for a complete relaxation of the magnetization/spin dynamics before a new pump pulse excites the sample again. The relaxation time of the magnetization/spin dynamics in ferromagnetic metallic samples is at least a few nanoseconds. Hence, the lasers with repetition rates of 200-300 MHZ or less will have to be used for the practical realization of a time-domain magnetometer.

A larger intensity pump laser pulse from the first laser will be used to excite the spin dynamics in magnetic materials, while a weaker probe laser pulse from the second laser is used to observe the sample magnetization/spin dynamics spanning from femtosecond to nanosecond time intervals from the moment of excitation. Such fast processes are measured using a relatively slow electronics, with a bandwidth near 100 MHZ by converting the fast experiment time into an easily accessible laboratory time. The pump and probe laser pulse pairs from the two independent lasers arrive initially at a coincident time on the sample surface. The next pair of pulses is already time delayed due to the small detuning of the individual laser repetition frequencies. The delay between pulses grows continuously in time at a constant rate to permit excitation and observation of the magnetization/spin dynamics.

Figure 8:
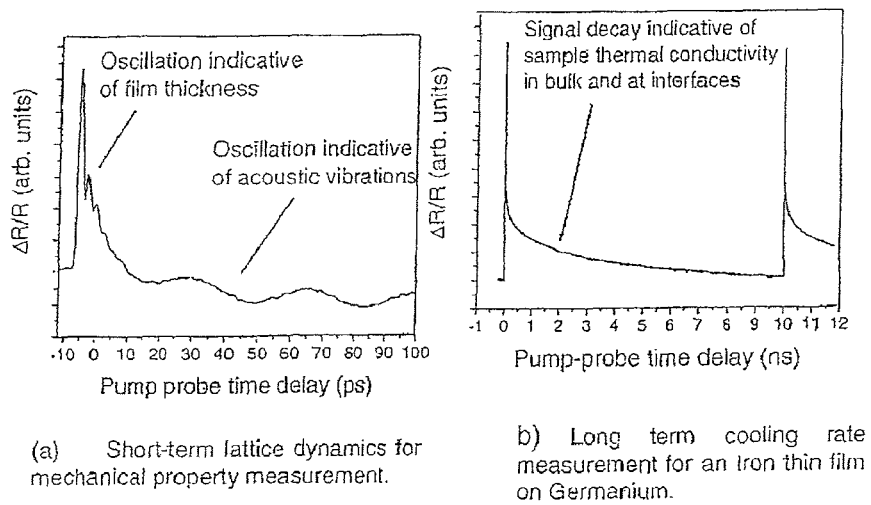
FIG. 8 illustrates dual-laser measurements.

The measurements performed using a commercial dual-fiber laser system from Menlo Systems can be seen in FIG. 8, featuring the acoustic phonon propagation detection and the probing of the thermal relaxation over ten nanosecond time intervals between successive pump pulse excitations. The data present an application example for time resolved spectroscopy using the dual laser synchronization scheme where only the sample reflectivity changes are detected. Further implementation of the methods described in the section 2 a) or 4 will permit measurements of the magnetization/spin dynamics that are presently proposed for ultrafast time-resolved magnetometry.

Figure 9:
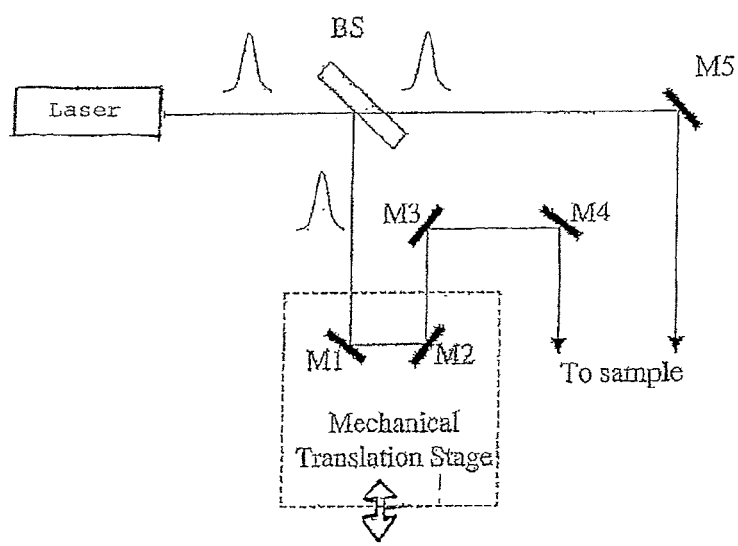
FIG. 9 illustrates a mechanical delay line single laser pump-probe setup.

We want to emphasize that the measurements based on the stepper motor mechanical delay movements (see, FIG. 9) are much inferior in terms of scanning speed capabilities, as compared to the proposed dual-laser synchronization scheme at kilohertz rates. The implementation of the detection schemes described in this invention, combined with the dual-laser scanning scheme eliminating the need of mechanical delay line, will enable faster and more sensitive measurements of the time-resolved magnetization/spin dynamics for magnetometry applications.

Based on our preliminary testing, it is estimated that the sensitivity capability of the present technique will be able to measure relative intensity changes corresponding to at least one part in a million in a measurement time interval of one minute or less. Industrial manufacturers of large magnetic wafers could benefit from the present method's sensitivity, which is capable of achieving nanometer accuracy and fast spectra acquisition for an efficient magnetic property characterization.

3) Advantages or Improvements Over Existing Methods, Devices or Materials

To our knowledge, there is currently no equivalent time-resolved magnetometer available on the market or related intellectual property. Moreover no instrument is known to exist that covers the coupled excitations of magnetic and thermal character over the unprecedentedly wide range of time scales achieved with this invention.

Frequency domain based techniques such as ferromagnetic resonance (FMR) or Brillouin light scattering (BLS) could in principle extract similar information about magnetic properties as the presently described invention. However, the BLS technique is limited in sensitivity and speed, as compared to our technique, while the FMR technique does not permit large sample characterization. Furthermore, FMR cannot measure the thermal and acoustic excitations that accompany the magnetic excitations.

At the present magnetic characterization techniques and metrology tools use MOKE hysteresis loop tracers to extract the magnetic properties (see for example U.S. Pat. No. 6,501, 269 and the Durham Magneto Optics Ltd. website: http://www.dms-magnetics.com/index.htm). These techniques do not offer time-resolved measurement capability and cannot be used extract the dynamical response of magnetic properties where time resolution is critical. The MOKE hysteresis loops are measured in relative intensity units and complicated calibration methods are needed for quantitative measurements of magnetic proprieties other than the coercive field values. By comparison, in the presently described invention, the time-resolved magnetization/spin dynamics spectra do not require such calibrations for detected intensities and the quantitative measurements of magnetic properties are based on the frequency conversion of the time-resolved oscillations and the associated relaxation rates in absolute measurement units. Additionally, our technique has the advantage of using faster (kilohertz) scanning rates than those available in MOKE hysteresis loop tracers providing the capability of obtaining a larger signal to noise ratio for measurements of a broad range of magnetic properties.

4) Possible Variations and Modifications and their Technical Description a) Alternatives for the Detection Scheme During the Ultrafast Time-Resolved Magnetometry 1) In the simple scheme from FIG. 6, a single probe pulse is used where phase detection is done by splitting the probe polarization into two orthogonal components directed toward two individual photo detectors that are balanced using a waveplate placed before the polarization beam splitter. Additionally, the two split orthogonal probes will travel the same distance from the beam splitter to the detector by matching the optical beam paths for the two orthogonal components of polarization. Using this scheme for the magneto-optical detection, a large non-magnetic background component to the measured signal is subtracted by eliminating the Fresnel reflectivity changes that do not contain information about the magnetization/spin dynamics. The measurement can be done in oblique incidence geometry for the measurements of in-plane magnetized samples, as well as, normal incidence for the out-of-plane magnetized samples.

We note that when using simpler reflectivity detection without a polarization beam splitter before the detector, thermal relaxation processes can be measured as shown in FIG. 8. This would permit alternative measurement capabilities of thermal properties of thin films, such interface and film thermal conductivity.

Figure 10B:
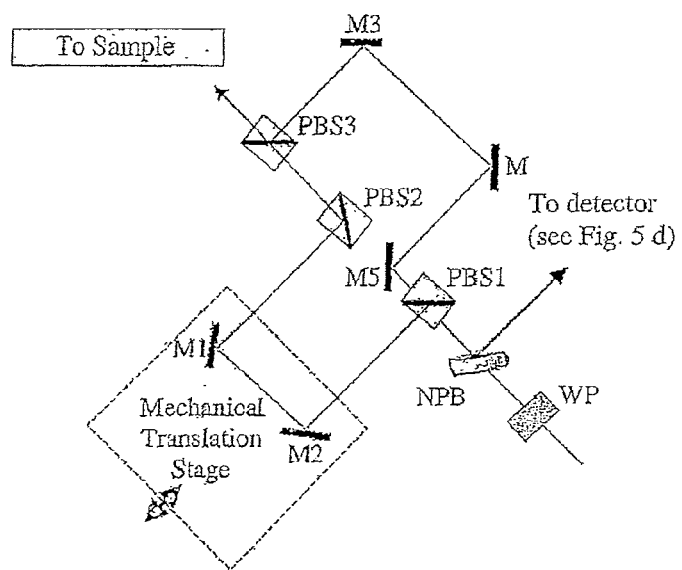
FIG. 10b illustrates a dual-laser magnetometer-interferometer of the dual-laser magnetometer with interferometer and collimation system.
Figure 10D:
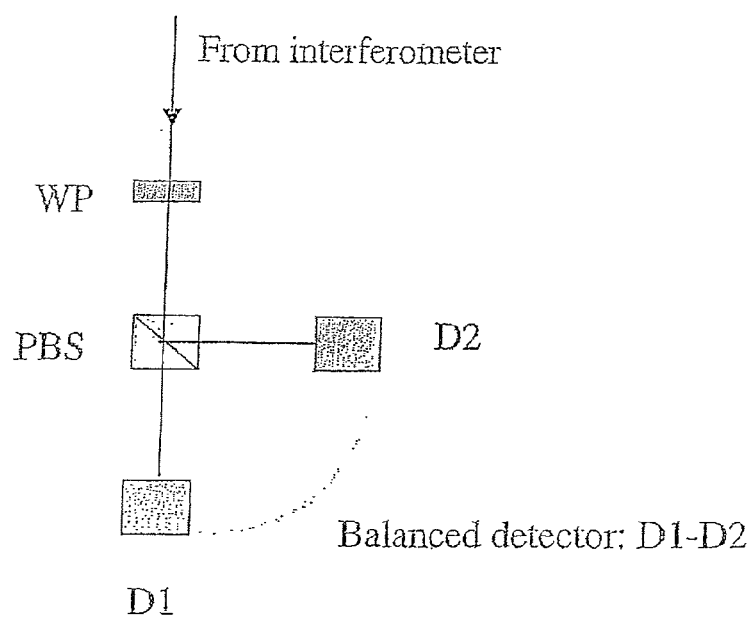
FIG. 10d illustrates a dual-laser magnetometer-detection of the dual-laser magnetometer with interferometer and collimation system.

2) An alternative two probe interferometry at oblique incidence (FIGS. 10a and 10b) with a few alternatives for the measurement geometry is provided and could be implemented to achieve better measurement sensitivity by:
  i) eliminating large background contributions to the detected signal such as reciprocal polarization rotations produced by the optical components or the sample itself by employing a two time delayed counter propagating probe pulse interference scheme,
  ii) Subtracting a large static magneto-optical background signal by probing the sample twice from two symmetric oblique incidence directions while separating the detection laser induced magnetization/spin dynamics.

The proposed scheme using two probe pulse interference detection of magnetization/spin dynamics is implemented by adjusting the laser pulse travel beam paths to ensure that the arrival time at the sample surface is an integer number of time periods between successive laser pulses (10 ns for 100 MHZ laser repetition rate). Under this detection scheme, each one of the two probe pulses involved in detection not only probes the sample twice but also probes the magnetization/spin dynamics at the same delay with respect to the pump beam ensuring that the phase information is preserved during the measurement. The advantages of the described dual probe interference are a better subtraction of optical, thermal and vibration instrument components to the detected signal by reducing the measurement background and thus enhancing the signal to noise ratio. At the same time each one of the two probe pulses collects the useful sample signal twice assuring a four times larger sensitivity compared with only one reflection on the sample surface in the single probe detection scheme of FIG. 6.

We expect that the enhanced sensitivity of the dual probe beam interferometry scheme proposed here will enable easier measurements of nanostructured magnet properties in addition to the measurements of magnetic thin films.

3) An additional complementary technique for film thickness measurements can be incorporated in the same instrument while performing sample/wafer magnetic characterization, or it can be considered as a distinct instrument alternative. For instance, the interferometer part from FIG. 5b can be implemented at normal incidence together with the one at oblique incidence by using separated probe beams from one of the two lasers. To our knowledge a new interference detection scheme is proposed for the first time, using a dual ultrafast laser system and employing an adjustable phase scheme for the two probe pulse interferometry at normal incidence. While the pump beam can be used for excitation at either oblique incidence or normal incidence, two probe beams at normal incidence are employed to realize optimal sensitivity for thin film thickness measurements by tuning the two probe beam path difference to half of the inverse frequency of acoustic vibrations indicative of thin film thickness. The acoustic vibration frequency tuning can be done using a fast mechanical line for adjusting the beam path difference between the two interfering probe beams to match half of the acoustic vibration period. Our interferometric detection scheme should efficiently subtract a large background on the detected signal while doubling the sensitivity of the acoustic measurement.

4) Another type of measurement for magnetic properties at the interfaces can be made using the ultrafast laser induced magnetic second harmonic generation (SHG) or third harmonic generation (THG) that is sensitive to a couple of monolayers at the interfaces rather then measuring the bulk properties of the sample. One possible choice is to simply look at the variations of the SHG signal anisotropy or strength across the sample surface. Another choice is to perform fast repetitive magnetic hysteresis to identify the differences between the bulk and interfacial properties that could affect the magnetic switching properties at the interlayer interfaces. Yet another choice is to look at the magnetic SHG dynamics in the pump and probe geometry described earlier to identify new differences between bulk and surface properties.

5) In another application, the pump and probe spectroscopy described under the present disclosure could be adapted for alternative measurement of all-optical electron paramagnetic resonance (EPR) or electron spin resonance (ESR) on nonmagnetic samples including solid and liquid state samples with applications in the electronics industry, as well as, biology. This particular application relies on the nonmagnetic sample spin level splitting into two non-degenerate levels under the application of an external magnetic field. The laser pump polarization could be modulated using an electro-optical modulator from a polarization of left hand helicity to right hand helicity for each successive adjacent laser pulses. While the setup described in FIGS. 10a and 10b can still be used at either normal or oblique incidence, an additional electro-optical phase modulator is inserted on the pump laser beam path. The phase modulation synchronized with the repetition frequency of the pump laser creates a different sign of spin excitations during the adjacent time intervals between two successive pump laser pulses. At the same time the non magnetic background remains the same after each pump pulse. A two probe interference detection scheme (as described in FIGS. 10a and 10b) could be used to extract the spin dynamics signal, while subtracting a large background of non-magnetic based dynamics. The two probe beams should arrive at the sample after being separated in time by the inverse of probe laser repetition frequency to preserve the phase information intact. The all optical EPR/ESR described here could be used as an alternative technique to existing instrumentation capabilities by adding very good spatial resolution capabilities. Additionally, it can be applied for the magnetic properties measurements of solid-state or liquid-state samples as well.

5) Optical Magnetometer Features
  a) Non-contact and non-destructive time-resolved optical magnetometer applied for measurements of magnetic, thermal and mechanical properties;
  b) Very fast temporal scanning over femtosecond to nanosecond time intervals for magnetic property measurements;
  c) Enhanced detection sensitivity achievable under the dual interference detection schemes presently described; and
  d) Broad instrumentation capabilities to include magnetic characterization, film thickness measurements, thermal and mechanical properties, and optical spin resonance in paramagnetic materials.

Appendix B

Asynchronous Optical Probing of Coherent Magnetic Excitations from Picoseconds to Nanoseconds Abstract: Thermoreflectance and coherent spin dynamics in Fe films are measured using asynchronous optical sampling at kilohertz rates. We observe ultrafast laser-induced time dependence of spin precession frequencies that is attributed to thermal relaxation.

The following references are cited herein:
1. V. A. Stoica, Y. M. Sheu, D. A. Reis, and R. Clarke, "Wideband detection of transient solid-state dynamics using ultrafast fiber lasers and asynchronous optical sampling," Optics Express, 16, 2322 (2008).
2. V. A. Stoica, R. Merlin, R. A. Lukaszew, and R. Clarke (unpublished).
3. W. S. Capinski and H. J. Maris, "Improved Apparatus for Picosecond Pump-and-Probe Optical Measurements," Rev. Sci. Instrum., 67, 2720-2726 (1996).
4. V. A. Stoica and R. Clarke, "Ultrafast laser induced changes to the magnetic anisotropy in epitaxial ferromagnetic metals," presented at 10th Joint MMM/Intermag Conference, Baltimore, Md., USA, Jan. 7-11, 2007.
5. M. Farle, "Ferromagnetic resonance of ultrathin metallic layers," Rep. Prog. Phys. 61, 755-826 (1998).
6. A. Paddock and G. L. Eesley, "Transient thermoreflectance from thin metal-films," J. Appl. Phys. 60, 285-290 (1986).

We report on recent measurements of the coupling between long-lived coherent picosecond magnetic oscillations and nanosecond thermal relaxation relaxation processes in epitaxial Fe films [1]. Ultrafast non-degenerate pump-probe measurements, based on asynchronous optical sampling (ASOPS), are performed at kilohertz scanning rates and make use of two mode-locked ultrafast fiber lasers with 100 MHZ repetition frequencies. This represents a much improved experimental approach over the traditional single laser technique that employs slow mechanical translation for time delay scanning [2]. For 10 ns time delays, we take full benefit of the ASOPS technique by eliminating the need for mechanical translation over large distances, which requires systematic error compensation [3].

Figure 11:
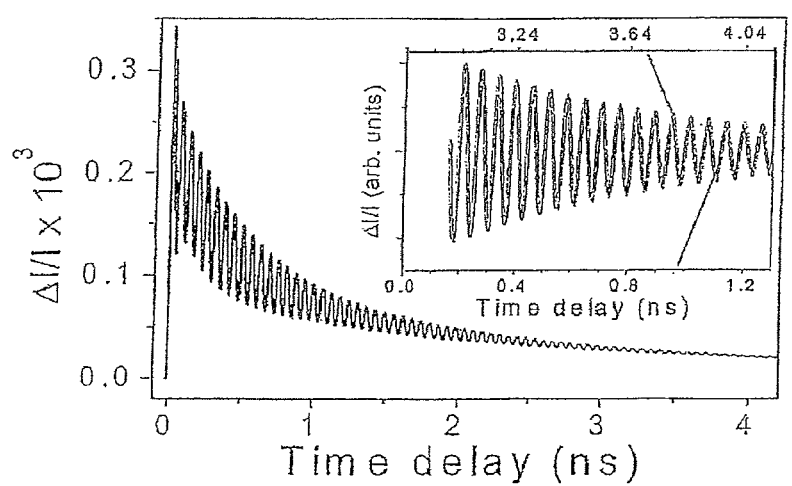
FIG. 11 illustrates an experimental coherent magnetization oscillation in Fe/Ge (110); and non-exponential decay is visible in the inset (after non-oscillatory background subtraction) when comparing the first few oscillations (black) with normalized and time shifted oscillations after 2 ns (red)

Coherent magnetization oscillations are measured on a 15 NM Fe epitaxial film deposited on (110) Ge substrate. An illustration of the excellent quality of the pump-probe data obtained with our approach is shown in FIG. 11. A non-exponential oscillation decay is found (see inset of FIG. 11) when a canted magnetic field of a few thousand Oe is applied. A dual spin oscillation contribution can be obtained using phase separation of overlapping modes with independent decay times [1].

Figure 12:
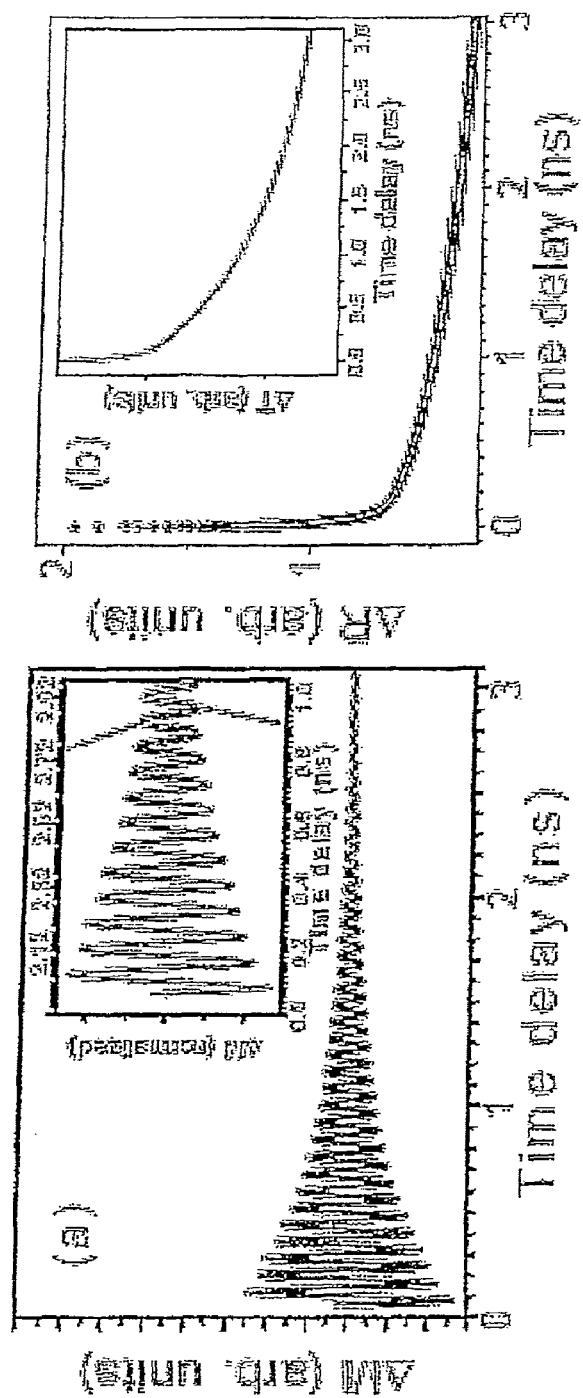
FIG. 12 illustrates an experimental spin dynamics curve (black) after subtracting the non-oscillatory background and fit (red) of coherent oscillations with a time-dependent frequency is shown in (a), with inset comparing the oscillations from first 1 ns with oscillations at times longer than 2 ns after normalization and temporal shift; and thermoreflectance experimental curve (black) of thick (70 nm) Fe film and fit (red) is shown in (b), with inset being the simulated cooling curve for the 15 nm Fe sample, obtained from fitting the curve in (a)

In prior measurements based on mechanical delay line scanning, we observed a transient pump-beam-induced modification to the frequency of oscillations [4]. Although we determined the laser-induced modification of magnetic anisotropy from the measured frequency shifts, we could not follow the extended oscillation relaxation only having a maximum time delay of 600 ps. With the ASOPS approach we can now follow the relaxation up to 10 nsec. The oscillation frequency corresponding to a magnetic field applied parallel to the sample plane can be obtained from the Landau-Lifshitz equation:

$$\left(\frac{2\pi f}{\gamma}\right)^2 = [H\cos(\theta_M - \theta_H) + H_{k1}][H\cos(\theta_M - \theta_H) + H_{k2} + 4\pi M_{eff}] \quad (1)$$

where f is the precession frequency, γ is the gyromagnetic ratio, H is the external magnetic field, $\theta_M$ is the magnetization orientation angle, $\theta_H$ is the external field orientation angle, $H_{k1}$ and $H_{k2}$ include magnetocrystalline anisotropies [5], and Meff represents the average magnetization value including the out-of-plane anisotropy. The laser-induced changes of the magnetic anisotropy were found to contribute to $H_{k1}$, $H_{k2}$ and Meff [4]. In the small perturbation limit and retaining the leading terms, we can account for the laser-modified frequency of oscillations by replacing f with $f_{pump-off}+\Delta f_{pump-on}$. After applying an in-plane magnetic field of a few hundred Oe and pump laser fluencies of up to 2 mJ/cm², we determine here that $\Delta f_{pump-on}$ is time dependent over nanosecond time delays (see FIG. 12(a)). The inset from FIG. 12(a) compares the beginning with the end of the oscillatory spectrum showing that spin precession relaxation follows an exponential decay while the oscillation frequency is time dependent. The origin of the $\Delta f_{pump-on}$ variation is attributed to transient pump-induced changes in sample temperature ($\Delta T(t)$). The transient temperature can be obtained from thermoreflectance measurements [6], although we could not separate the thermoreflectance signal for the 15 NM Fe film due to probe beam penetration into the Ge substrate that produces additional signal contributions. A complementary thermoreflectance measurement is then made for a thicker epitaxial Fe film (70 NM) deposited on (110) Ge. FIG. 12(b) shows the thermoreflectance experimental curve and a numerical fit based on a heat diffusion model described in [1], determining the film thermal conductivity (46 W/Km) and Fe/Ge interface boundary conductance (2.1×10⁸ W/m²K). We use these values to simulate the thermal cooling curve for the 15 NM Fe film (inset from FIG. 12(b)). We then assume that $\Delta f_{pump-on}(t)$ is linearly proportional to $\Delta T(t)$. A fit using an exponentially damped cosine function with $2\pi[(f_{pump-off} t+k\Delta T(t)t+\phi)]$ argument shows excellent agreement with the experiment (FIG. 12a), where φ is a phase shift and k is a negative normalization factor corresponding to a negative frequency shift with an amplitude of about 2% at t=66 ps.

In conclusion, we measure the coupling between thermal relaxation and coherent magnetic dynamics over a wide temporal range in epitaxial Fe films, through a thermo-magnetic shift in the precession frequency and time-domain thermal reflectance measurements.

Appendix C

Probing laser-induced structural changes using coherent phonon detection

Abstract: We find the onset of laser-induced InSb thermal dissociation using coherent optical phonon detection under asynchronous optical sampling. Additionally, laser-induced annealing of Sb thin films is monitored in photoacoustic measurements of sound velocity in real-time.

The following references are cited herein:
1. V. A. Stoica, Y. M. Sheu, D. A. Reis, and R. Clarke, "Wideband detection of transient solid-state dynamics using ultrafast fiber lasers and asynchronous optical sampling," submitted to Opt. Express.
2. A. M. Lindenberg et al. "Atomic-scale visualization of inertial dynamics," Science 308, 392-395 (2005).
3. G. A. Garrett at al., "Coherent THz phonons driven by light pulses and the Sb problem: What is the mechanism?," Phys. Rev. Lett. 77, 3661 (1996).
4. S. Hunsche at al., "Impulsive softening of coherent phonons in tellurium," Phys. Rev. Lett. 75, 1815-1818 (1995).
5. D. M. Fritz, D. A. Reis, et al. "Ultrafast bond softening in bismuth: Mapping a solid's interatomic potential with x-rays," Science 315, 633-636 (2007).
6. G. Tas and H. J. Maris, "Electron diffusion in metals studied by picosecond ultrasonics," Phys. Rev. B 49, 15046-15054 (1994).

We have recently shown that coherent optical and acoustic phonon excitations in time-domain could be efficiently detected using non-degenerate time-domain spectroscopy based on ultrafast fiber lasers and asynchronous optical sampling (ASOPS) [1]. In the present paper, we employ the same experimental apparatus for measurements of laser-induced irreversible changes at surfaces of InSb and Sb. A slow heat accumulation mechanism is found to produce surface InSb dissociation, followed by Sb crystallization that was identified in the coherent optical phonon spectrum. For the case of pure Sb thin films deposited on (111) Si, a laser-induced thermal annealing effect could be probed, based on monitoring coherent acoustic phonon dynamics with spectrum update rates of 1 second.

Figure 13:
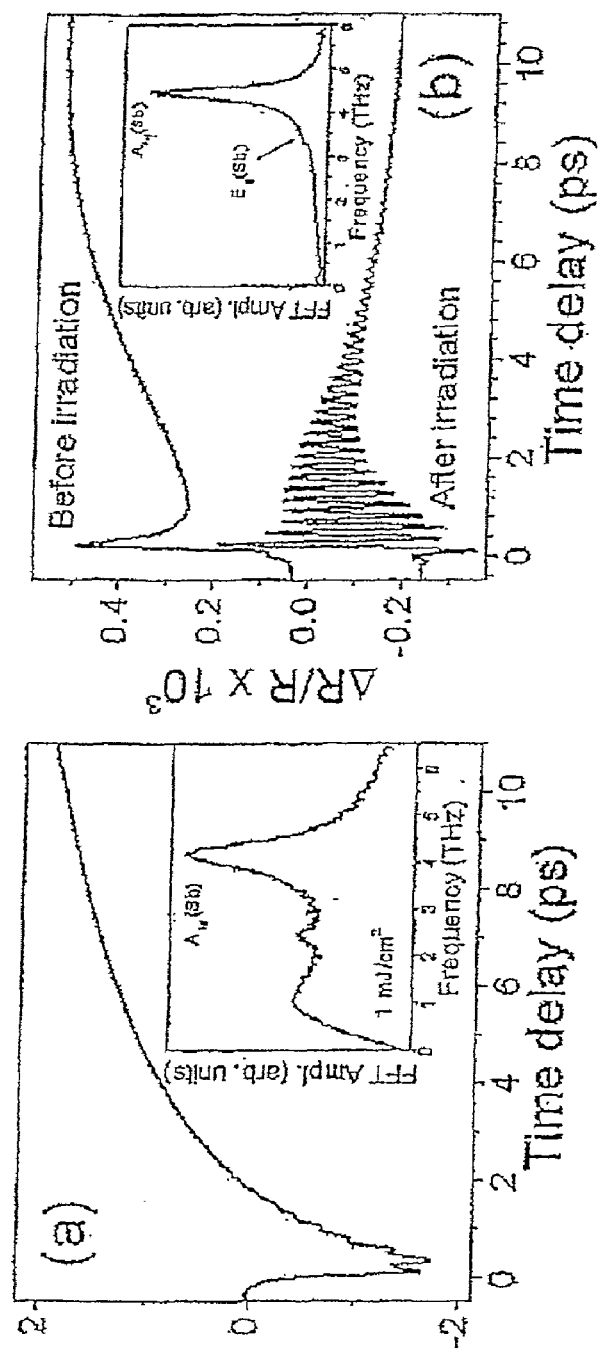
FIG. 13 illustrates a transient reflectivity measurement on InSb using 780 nm probe as shown in (a), where the FFT from inset is obtained from the oscillatory signal after subtracting the slowly varying background; and transient reflectivity curves measured at 0.2 mJ/cm$^2$ pump fluency are shown in (b) before and after irradiation with 2mJ/cm$^2$ fluency pulses, where FFT from inset corresponds to oscillatory part from the lower curve.

InSb is a low bandgap semiconductor that undergoes a nonthermal phase transition upon intense ultrafast-laserexcitation, that has been probed recently through time-resolved x-ray diffraction [2]. By performing reflectivity studies under variable pump power, we have found that a thermal damage threshold is imposed by heat accumulation effects under repetitive excitation at the laser frequency of 100 MHZ and a pump wavelength of 1560 NM. At a characteristic threshold pump laser fluence of about 0.9 mJ/cm$^2$, we find that coherent oscillations appear in the transient reflectivity curve (FIG. 13($a$)), which is correlated with a permanent increase of sample reflectivity.

Figure 14:
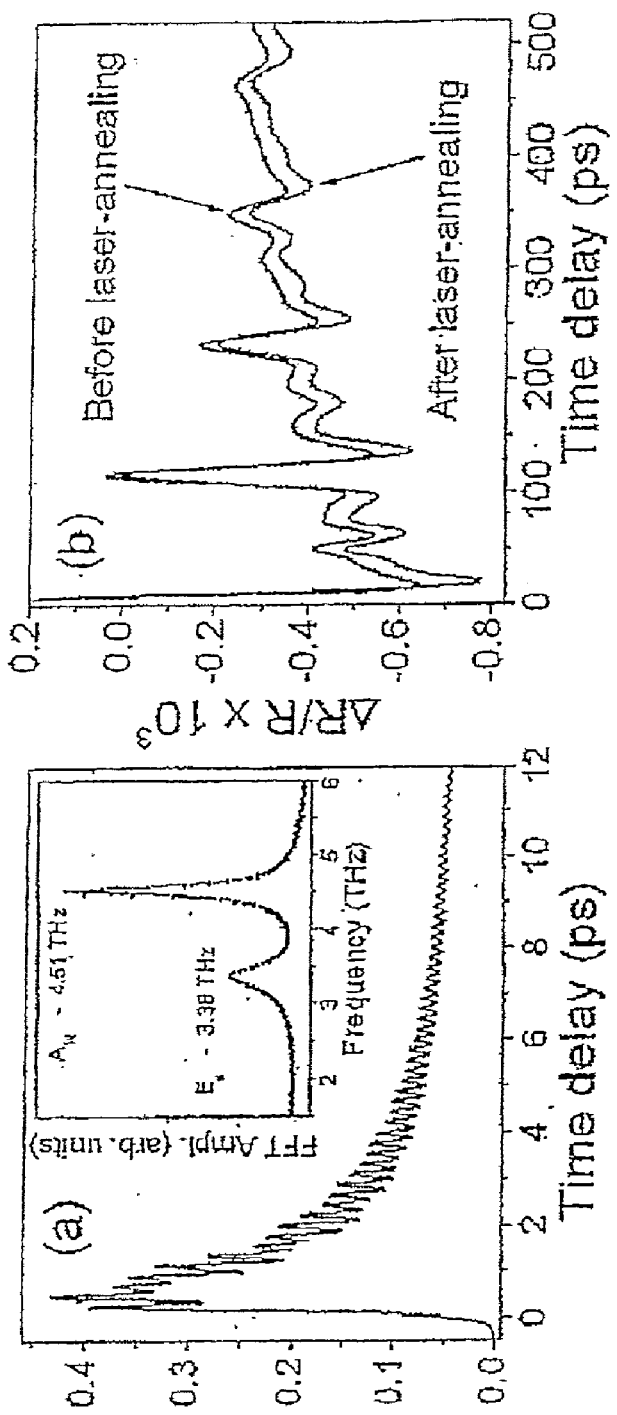
FIG. 14 illustrates Sb optical phonon reflectivity spectrum ASOPS as shown in (a), which is measured at 30 mJ/cm$^2$ pump power dual-color pump (1560 nm) and probe (780 nm), with inset showing the FFT spectrum corresponding to the oscillatory part only; and acoustic echo sequence following after optical phonon relaxation as shown in (b) for the same pump fluency of 0.6 mJ/cm$^2$, where the lower (red) curve is measured after irradiation at near 2 mJ/cm$^2$ and for about 2 minutes.

The amplitude of oscillation varies nonlinearly with the pump power and exposure time. After irradiating a fresh sample spot at 2 mJ/cm$^2$ for a few seconds, we compare the measurements taken before and after laser exposure in FIG. 13($b$). We identify the origin of oscillation as coherent Sb zone-center optical phonon modes [3] (FIG. 13($b$) inset) by direct comparison with a measurement (FIG. 14($a$)) of a highly textured polycrystalline Sb thin film grown on Si with the c-axis at a few degrees from the Si [111] direction. Near the onset for InSb dissociation, the $A_{1g}$ mode of Sb is red shifted (FIG. 13($a$) inset), which is characteristic behavior for optical phonons in semimetals exposed to high density photoexcitation [4-5]. The peak at 2.42 THz is not well understood, while it can be attributed to the InSb dissociation phase because it disappears after exposure at larger pump fluence that completes the InSb surface dissociation process. Using the average reflectivity changes and bulk optical constants of InSb and Sb, we can estimate that the thickness of the surface Sb layer is in the 5-10 NM range. When using the pump laser in continuous wave mode operation, we find that heat accumulation leading to InSb dissociation is even more dramatic and has a reduced threshold of about 0.4 mJ/cm$^2$.

Measurements performed on a Sb thin film show a rich spectrum of picosecond coherent acoustic oscillations extending to several nanosecond delay times. We identify an echo-type structure (FIG. 14($b$)) that is reminiscent of studies from [6], and contains a sequence of small and large alternating peaks that are produced by the strain excitation and propagation from the substrate interface and Sb surface, respectively. A laser-induced irreversible structural change for pure Sb was measured at a threshold of about 1 mJ/cm$^2$ by monitoring the acoustic echo spectrum. The origin of laser-induced acoustic echo spectrum modification can be understood by observing that after large pump fluency exposure, the echo peaks are shifted to longer delay times with the shift being larger at later times. We interpret such shifts as a reduction of sound velocity that is generated by a thermal pump-laser-annealing effect at large fluence to produce thin film defect density reduction or a modification of the grain texture. By monitoring the time elapsed between the echo at 117 ps and the one at near 350 ps we could monitor the gradual sound velocity reduction. A sound velocity value with 2% smaller then the original value is found after irradiation with 2 mJ/cm$^2$ fluence pulses.

In conclusion, based on non-degenerate ASOPS, we demonstrated coherent detection of optical or acoustic phonons that is used to monitor laser-induced structural changes. Both surface dissociation of InSb and Sb thin film annealing were found to take place at large pump fluencies with a similar threshold behavior at near 1 mJ/cm$^2$.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of measuring at least one property including a magnetic property of target material, the method comprising the steps of:
   generating a pump pulse train having one or more pump pulses at a repetition rate along a first propagation path, each pump pulse having a pulse energy density, a laser wavelength within a range of laser wavelengths, and a pulse duration;
   irradiating the target material with at least a portion of the one or more pump pulses focused into at least one spot having a spot shape and size so as to cause transient perturbation in the target material;
   generating at least one probe pulse train having one or more probe pulses at a repetition rate along a second propagation path, each probe pulse having a pulse energy density, a laser wavelength within a range of laser wavelengths, and a pulse duration;
   irradiating the target material with at least a portion of the one or more probe pulses focused into at least one spot having a spot shape and size to obtain one or more reflected probe pulses which are modulated based on the transient perturbation;
   electronically controlling a time interval between a time at which the target material is irradiated by each of the focused pump pulses and a time at which the target material is irradiated by each of its corresponding focused probe pulses wherein the time interval is capable of being controlled to be greater than or less than 1 ns;
   detecting each modulated probe pulse to obtain one or more corresponding signals; and
   processing the one or more signals to obtain one or more measurement signals which represents the at least one property including the magnetic property of the target material.

2. The method as claimed in claim 1, wherein the at least one spot of the pump and probe pulses substantially overlap.

3. The method as claimed in claim 1, wherein the first and second propagation paths are substantially collinear or substantially non-collinear.

4. The method as claimed in claim 1, wherein the steps of irradiating are performed on the target material either obliquely or at normal incidence.

5. A method of measuring at least one property including a magnetic property of target material, the method comprising the steps of:
   generating a pump pulse train having one or more pump pulses at a repetition rate along a first propagation path, each pump pulse having a pulse energy density, a laser wavelength within a range of laser wavelengths, and a pulse duration;

irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, wherein the at least one property also includes a thermal property of the target material and wherein the method further comprises adjusting pump beam intensity to modify transient temperature and stress to allow correlation between the thermal and magnetic properties.

6. A method of measuring at least one property including a magnetic property of target material, the method comprising the steps of:

generating a pump pulse train having one or more pump pulses at a repetition rate along a first propagation path, each pump pulse having a pulse energy density, a laser wavelength within a range of laser wavelengths, and a pulse duration;

irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, wherein the at least one property also includes a mechanical property of the target material and wherein the method further comprises adjusting pump beam intensity to select transient temperature and stress to allow correlation between the mechanical and magnetic properties.

7. A method of measuring at least one property including a magnetic property of target material, the method comprising the steps of:

generating a pump pulse train having one or more pump pulses at a repetition rate along a first propagation path, each pump pulse having a pulse energy density, a laser wavelength within a range of laser wavelengths, and a pulse duration;

irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, and wherein the method further comprises adjusting pump beam intensity to determine thresholds for at least one of permanent material modification and change.

8. The method as claimed in claim 1, wherein the pulse duration of the pump and probe pulses is less than 100 ps.

9. The method as claimed in claim 1, wherein the pulse energy densities of the pump and probe pulses are less than 20 mJ/cm2.

10. The method as claimed in claim 1, wherein the repetition rates of at least two of the pulse trains are different and wherein the method further comprises selectively controlling repetition rate difference between the at least two pulse trains between 10 Hz and 1 MHz.

11. The method as claimed in claim 1, wherein the step of controlling controls the time interval within a temporal measurement window from 10 fs to 500 ns.

12. The method as claimed in claim 1 further comprising applying a magnetic field external to the target material during the steps of irradiating.

13. The method as claimed in claim 1, wherein the spot shape of the pump and probe pulses is one of circular, elliptical, square and rectangular.

14. The method as claimed in claim 1, wherein the step of controlling is performed electronically by maintaining a fixed phase relationship between pump and probe pulse trains and wherein the steps of generating are performed by at least two different lasers.

15. The method as claimed in claim 1, wherein the spot size of the pump and probe pulses on the target material is between 0.2 μm2 and 0.01 mm2.

16. The method as claimed in claim 1, wherein the target material includes a film having a thickness between 1 nm and 10 μm formed as a single layer or as part of a multilayer on a substrate.

17. A method of measuring at least one property including a magnetic property of target material, the method comprising the steps of:
generating a pump pulse train having one or more pump pulses at a repetition rate along a first propagation path, each pump pulse having a pulse energy density, a laser wavelength within a range of laser wavelengths, and a pulse duration;
irradiating the target material with at least a portion of the one or more pump pulses focused into at least one spot having a spot shape and size so as to cause transient perturbation in the target material;
generating at least one probe pulse train having one or more probe pulses at a repetition rate along a second propagation path, each probe pulse having a pulse energy density, a laser wavelength within a range of laser wavelengths, and a pulse duration;
irradiating the target material with at least a portion of the one or more probe pulses focused into at least one spot having a spot shape and size to obtain one or more reflected probe pulses which are modulated based on the transient perturbation;
electronically controlling a time interval between a time at which the target material is irradiated by each of the focused pump pulses and a time at which the target material is irradiated by each of its corresponding focused probe pulses;
detecting each modulated probe pulse to obtain one or more corresponding signals; and
processing the one or more signals to obtain one or more measurement signals which represents the at least one property including the magnetic property of the target material, the method as claimed in claim 1 further comprising applying a magnetic field external to the target material during the steps of irradiating, and wherein the method further comprises applying a magnetic field external to the target material during the step of irradiating and controlling magnetic field direction and strength with respect to orientation of the target material to determine at least one of magnetic anisotropy, saturation magnetization, anisotropic magnetization relaxation rates and time-dependent hysteresis.

18. A method of measuring at least one property including a magnetic property of target material, the method comprising the steps of:
generating a pump pulse train having one or more pump pulses at a repetition rate along a first propagation path, each pump pulse having a pulse energy density, a laser wavelength within a range of laser wavelengths, and a pulse duration;
irradiating the target material with at least a portion of the one or more pump pulses focused into at least one spot having a spot shape and size so as to cause transient perturbation in the target material;
generating at least one probe pulse train having one or more probe pulses at a repetition rate along a second propagation path, each probe pulse having a pulse energy density, a laser wavelength within a range of laser wavelengths, and a pulse duration;
irradiating the target material with at least a portion of the one or more probe pulses focused into at least one spot having a spot shape and size to obtain one or more reflected probe pulses which are modulated based on the transient perturbation;
electronically controlling a time interval between a time at which the target material is irradiated by each of the focused pump pulses and a time at which the target material is irradiated by each of its corresponding focused probe pulses;
detecting each modulated probe pulse to obtain one or more corresponding signals; and
processing the one or more signals to obtain one or more measurement signals which represents the at least one property including the magnetic property of the target material, and wherein the method further comprises controlling polarization orientation of the pump and probe pulses to one of linear, circular or elliptical polarization for perturbation excitation and detection to measure component resolved magnetization dynamics or vector-resolved MOKE technique for characterization.

19. A method of measuring at least one property including a magnetic property of target material, the method comprising the steps of:
generating a pump pulse train having one or more pump pulses at a repetition rate along a first propagation path, each pump pulse having a pulse energy density, a laser wavelength within a range of laser wavelengths, and a pulse duration;
irradiating the target material with at least aportion of the one or more pump pulses focused into at least one spot having a spot shape and size so as to cause transient perturbation in the target material;
generating at least one probe pulse train having one or more probe pulses at a repetition rate along a second propagation path, each probe pulse having a pulse energy density, a laser wavelength within a range of laser wavelengths, and a pulse duration;
irradiating the target material with at least a portion of the one or more probe pulses focused into at least one spot having a spot shape and size to obtain one or more reflected probe pulses which are modulated based on the transient perturbation;
electronically controlling a time interval between a time at which the target material is irradiated by each of the focused pump pulses and a time at which the target material is irradiated by each of its corresponding focused probe pulses;
detecting each modulated probe pulse to obtain one or more corresponding signals; and
processing the one or more signals to obtain one or more measurement signals which represents the at least one property including the magnetic property of the target material, and wherein the method further comprises adjusting relative phase and polarization between pairs of probe pulses.

20. The method as claimed in claim 1, further comprising controlling pump beam intensity based on pump pulse input power.

21. A method of measuring at least one property including a magnetic property of target material, the method comprising the steps of:
generating a pump pulse train having one or more pump pulses at a repetition rate along a first propagation path, each pump pulse having a pulse energy density, a laser wavelength within a range of laser wavelengths, and a pulse duration;
irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, and wherein the method further comprises increasing pump laser intensity to generate at least one of laser-induced large amplitude magnetic oscillations and transient magnetization switching to measure magnetization switching speed.

22. A method of measuring at least one property including a magnetic property of target material, the method comprising the steps of:

generating a pump pulse train having one or more pump pulses at a repetition rate along a first propagation path, each pump pulse having a pulse energy density, a laser wavelength within a range of laser wavelengths, and a pulse duration;

irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, and wherein the method further comprises controlling intensity and relative timing of at least two pump or probe beam pair sequences for enhanced perturbation excitation and detection, respectively.

23. A method of measuring at least one property including a magnetic property of target material, the method comprising the steps of:

generating a pump pulse train having one or more pump pulses at a repetition rate along a first propagation path, each pump pulse having a pulse energy density, a laser wavelength within a range of laser wavelengths, and a pulse duration;

irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, and wherein the method further comprises controlling relative polarization between pair of probe and pump pulses to select either a magnetic, a thermal or a mechanical characterization mode of the operation.

24. The method as claimed in claim 1, wherein the laser wavelength of each pump pulse is different from the laser wavelength of each probe pulse.

25. A method of measuring at least one property including a magnetic property of target material, the method comprising the steps of:

generating a pump pulse train having one or more pump pulses at a repetition rate along a first propagation path, each pump pulse having a pulse energy density, a laser wavelength within a range of laser wavelengths, and a pulse duration;

irradiating the target material with at least a portion of the one or more pump pulses focused into at least one spot having a spot shape and size so as to cause transient perturbation in the target material;

generating at least one probe pulse train having one or more probe pulses at a repetition rate along a second propagation path, each probe pulse having a pulse energy density, a laser wavelength within a range of laser wavelengths, and a pulse duration;

irradiating the target material with at least a portion of the one or more probe pulses focused into at least one spot having a spot shape and size to obtain one or more reflected probe pulses which are modulated based on the transient perturbation;

electronically controlling a time interval between a time at which the target material is irradiated by each of the focused pump pulses and a time at which the target material is irradiated by each of its corresponding focused probe pulses;

detecting each modulated probe pulse to obtain one or more corresponding signals; and processing the one or more signals to obtain one or more measurement signals which represents the at least one property including the magnetic property of the target material, and wherein the method further comprises irradiating the target material with a CW beam during one of the steps of irradiating to either change temperature of the target material or to provide an additional ellipsometric probe.

26. The method as claimed in claim 1, wherein the range of laser wavelengths for each pump and probe pulse is 0.1 to 10 micrometers.

27. A system for measuring at least one property including a magnetic property of target material, the system comprising:
- a pulsed laser source for generating a pump pulse train having one or more pump pulses at a repetition rate along a first propagation path, each pump pulse having a pulse energy density, a laser wavelength within a range of laser wavelengths, and a pulse duration;
- means for irradiating the target material with at least a portion of the one or more pump pulses focused into at least one spot having a spot shape and size so as to cause transient perturbation in the target material;
- a pulsed laser source for generating at least one probe pulse train having one or more probe pulses at a repetition rate along a second propagation path, each probe pulse having a pulse energy density, a laser wavelength within a range of laser wavelengths, and a pulse duration;
- means for irradiating the target material with at least a portion of the one or more probe pulses focused into at least one spot having a spot shape and size to obtain one or more reflected probe pulses which are modulated based on the transient perturbation;
- means for electronically controlling a time interval between a time at which the target material is irradiated by each of the focused pump pulses and a time at which the target material is irradiated by each of its corresponding focused probe pulses wherein the time interval is capable of being controlled to be greater than or less than 1 ns within a temporal measurement window from 10 fs to 500 ns;
- means for detecting each modulated probe pulse to obtain one or more corresponding signals; and
- means for processing the one or more signals to obtain one or more measurement signals which represents the at least one property including the magnetic property of the target material.

28. The system as claimed in claim 27, wherein the pulsed laser sources include at least one of a fiber laser, a crystalline laser media oscillator, an amplified CPA laser, an OPA laser, a laser diode, a Q-switched laser and a dye laser.

* * * * *

UNITED STATES PATENT AND TRADEMARK OFFICE
CERTIFICATE OF CORRECTION

| | | |
|---|---|---|
| PATENT NO. | : 8,264,693 B2 | Page 1 of 1 |
| APPLICATION NO. | : 12/315906 | |
| DATED | : September 11, 2012 | |
| INVENTOR(S) | : Vladimir A. Stoica et al. | |

It is certified that error appears in the above-identified patent and that said Letters Patent is hereby corrected as shown below:

Column 36, Line 28, Claim 19:

After "with at least" Delete "apportion" and
Insert -- a portion --.

Signed and Sealed this
Eighth Day of January, 2013

David J. Kappos
*Director of the United States Patent and Trademark Office*